(12) United States Patent
Tang et al.

(10) Patent No.: US 12,315,849 B2
(45) Date of Patent: May 27, 2025

(54) ARRAY BASE PLATE AND DETECTING METHOD THEREOF, AND LIGHT EMITTING APPARATUS

(71) Applicants: HEFEI BOE PIXEY TECHNOLOGY CO., LTD., Hefei (CN); BOE TECHNOLOGY GROUP CO., LTD., Beijing (CN)

(72) Inventors: Hai Tang, Beijing (CN); Liang Gao, Beijing (CN); Ming Zhai, Beijing (CN); Jianwei Qin, Beijing (CN); Xiaopan Che, Beijing (CN); Guanghe Ma, Beijing (CN)

(73) Assignees: HEFEI BOE PIXEY TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/793,521

(22) PCT Filed: Sep. 16, 2021

(86) PCT No.: PCT/CN2021/118687
§ 371 (c)(1),
(2) Date: Jul. 18, 2022

(87) PCT Pub. No.: WO2023/039786
PCT Pub. Date: Mar. 23, 2023

(65) Prior Publication Data
US 2024/0178196 A1    May 30, 2024

(51) Int. Cl.
H01L 25/075    (2006.01)
H10H 20/01    (2025.01)
H10H 20/857    (2025.01)

(52) U.S. Cl.
CPC ......... H01L 25/0753 (2013.01); H10H 20/01 (2025.01); H10H 20/857 (2025.01); *H10H 20/0364* (2025.01)

(58) Field of Classification Search
CPC ... H01L 25/0753; H01L 25/04; H01L 25/042; H10H 20/852
See application file for complete search history.

(56) References Cited

U.S. PATENT DOCUMENTS

2008/0232673 A1    9/2008   Miyauchi
2009/0091024 A1    4/2009   Zeng et al.
(Continued)

FOREIGN PATENT DOCUMENTS

CN    101272679 A    9/2008
CN    102931107 A    2/2013
(Continued)

*Primary Examiner* — Wasiul Haider
(74) *Attorney, Agent, or Firm* — WHDA, LLP

(57) ABSTRACT

The present application provides an array base plate and a detecting method thereof, and a light emitting apparatus, which relates to the technical field of displaying. The array base plate includes: a substrate, wherein the substrate includes a plurality of first light transmitting areas; and a first conductive layer located on the substrate; the first conductive layer includes a plurality of conductive-pad groups, and each of the conductive-pad groups includes at least one conductive pad; an overlapping area exists between an orthographic-projection area of the conductive pad on the substrate and one of the first light transmitting areas; and a transmittance of parts of the substrate that are located at the first light transmitting areas is greater than or equal to a first preset value.

20 Claims, 16 Drawing Sheets

(56) References Cited

U.S. PATENT DOCUMENTS

2013/0037940 A1    2/2013  Chen et al.
2015/0008462 A1    1/2015  Weng et al.
2017/0317230 A1*  11/2017  An ....................... H10H 20/018

FOREIGN PATENT DOCUMENTS

| CN | 104282819 A | 1/2015 |
| CN | 105979719 A | 9/2016 |

\* cited by examiner

ARRAY BASE PLATE AND DETECTING METHOD THEREOF, AND LIGHT EMITTING APPARATUS

TECHNICAL FIELD

The present application relates to the technical field of displaying, and more particularly, to an array base plate and a detecting method thereof, and a light emitting apparatus.

BACKGROUND

With the rapid development of the technique of displaying, display products of Mini LED (Mini Light Emitting Diode) and Micro LED (Micro Light Emitting Diode) have attracted broad attention. The soldering of those two types of LED chips is an important step of the manufacturing of the two types of display products. However, the problem of cold joint very easily emerges in the soldering of LED chips, which results in a conduction imperfect between the LED chip and the substrate, which results in deterioration of the quality of the display products.

SUMMARY

The embodiments of the present application employ the following technical solutions:

In an aspect, an embodiment of the present application provides an array base plate, wherein the array base plate includes:
 a substrate, wherein the substrate includes a plurality of first light transmitting areas; and
 a first conductive layer located on the substrate;
 the first conductive layer includes a plurality of conductive-pad groups, and each of the conductive-pad groups includes at least one conductive pad;
 an overlapping area exists between an orthographic-projection area of the conductive pad on the substrate and one of the first light transmitting areas; and
 a transmittance of parts of the substrate that are located at the first light transmitting areas is greater than or equal to a first preset value.

In some embodiments of the present application, the first preset value is greater than or equal to 50%.

In some embodiments of the present application, an area of the overlapping area occupies at least a half of an area of the orthographic-projection area of the conductive pad on the substrate.

In some embodiments of the present application, an edge of the orthographic-projection area of the conductive pad on the substrate is located within the first light transmitting area.

In some embodiments of the present application, a material of the parts of the substrate that are located at the first light transmitting areas includes a light transmitting material, and/or, the parts of the substrate that are located at the first light transmitting areas are of a hollow structure.

In some embodiments of the present application, at least two of the first light transmitting areas are communicated and form a second light transmitting area.

In some embodiments of the present application, orthographic-projection areas of some of the conductive-pad groups on the substrate overlap with the second light transmitting area.

In some embodiments of the present application, the substrate further includes a plurality of third light transmitting areas;
 the first conductive layer further includes a plurality of traces, and the traces are electrically connected to the conductive pad; and
 orthographic-projection areas of at least some of the traces on the substrate overlap with the third light transmitting areas.

In some embodiments of the present application, some of the third light transmitting areas are in communication with some of the first light transmitting areas, and/or, some of the third light transmitting areas are in communication with some of the second light transmitting areas.

In some embodiments of the present application, the substrate includes a bottom layer and a second conductive layer located on the bottom layer, and the second conductive layer is insulated from the first conductive layer;
 the second conductive layer includes a plurality of driving lines that are arranged in a first direction and extend in a second direction; and
 an orthographic projection of the third light transmitting area on the bottom layer is within an area between orthographic projections of two adjacent driving lines on the bottom layer.

In some embodiments of the present application, at least some of the third light transmitting areas are arranged in the first direction, and extend in the second direction.

In some embodiments of the present application, a distance from a contour of an orthographic projection of the light transmitting area on the first conductive layer to the conductive pad ranges 0-200 μm.

In some embodiments of the present application, a plurality of the conductive-pad groups are arranged in an array, and each of the conductive pads includes a metal layer and a connecting layer located on the metal layer;
 the array base plate further includes a plurality of element devices, and each of the element devices is electrically connected to a same one instance of the conductive-pad groups;
 the connecting layer is located between the metal layer and the element devices, and the metal layer is connected to the element devices by the connecting layer; and
 the connecting layer includes an intermetallic compound, and a morphology of the intermetallic compound is at least one of a block structure, a conchoid structure, a dendriform structure and a rice-granular structure.

In some embodiments of the present application, the intermetallic compound includes any one or more of $Cu_6Sn_5$, $Cu_3Sn$, $Ni_3Sn_4$, $(Cu,Ni)_6Sn_5$, $(Ni,Cu)_3Sn_4$ and $Ag_3Sn$.

In some embodiments of the present application, the array base plate further includes a soldering layer, the soldering layer is located between solder legs of each of the element devices and the conductive pad, and the soldering layer includes a soldering material; and
 when the soldering layer and the conductive pad directly contact, the morphology of the intermetallic compound is the rice-granular structure.

In some embodiments of the present application, the array base plate further includes a soldering layer, the soldering layer is located between solder legs of each of the element devices and the conductive pad, and the soldering layer includes a soldering material; and
 when an inhibiting layer is arranged between the soldering layer and the conductive pad, the morphology of the intermetallic compound is one or more of the block structure, the conchoid structure and the dendriform structure.

In some embodiments of the present application, the substrate includes a bottom layer, and a buffer layer, a second conductive layer, a first insulating layer, a first planarization layer and a second insulating layer that are located on the bottom layer and are sequentially arranged in stack;

all of materials of the buffer layer, the first insulating layer, the first planarization layer and the second insulating layer are a light transmitting material; and a material of parts of the second conductive layer that are located at the light transmitting areas is a light transmitting material, or, parts of the second conductive layer that are located at the light transmitting areas are of a hollow structure.

In another aspect, an embodiment of the present application provides a light emitting apparatus, wherein the light emitting apparatus includes the array base plate stated above.

In yet another aspect, an embodiment of the present application provides a detecting method, wherein the array base plate includes a plurality of element devices, each of the element devices is electrically connected to the conductive pads in a same one instance of the conductive-pad groups, and the method includes:

collecting a target image at a back of the array base plate, wherein the back is a surface of the substrate that is away from the conductive pads; and according to parameter information of the conductive pads in the target image, determining whether a connection imperfect exists between the element devices and the conductive pads.

In some embodiments of the present application, the parameter information includes an area of an orthographic projection of the connecting layer of the conductive pad on the substrate and an area of an orthographic projection of solder legs of the element devices on the substrate; and according to the parameter information of the conductive pads in the target image, determining whether the connection imperfect exists between the element devices and the conductive pads includes:

when the areas of the orthographic projections of the connecting layers of the conductive pads in the conductive-pad groups on the substrate are greater or equal to a second preset value compared with the areas of the orthographic projections of the soldering legs on the substrate, determining that connection between the element devices and the conductive pads is qualified; and when the area of the orthographic projection of the connecting layer of at least one of the conductive pads in the conductive-pad groups on the substrate is less than the second preset value compared with the areas of the orthographic projections of the soldering legs on the substrate, determining that the connection imperfect exists between the element devices and the conductive pads.

In some embodiments of the present application, the parameter information includes a model image of qualified connection between the element devices and the conductive pads; and the step of, according to the parameter information of the conductive pads in the target image, determining whether the connection imperfect exists between the element devices and the conductive pads includes:

when a similarity between the conductive pads in the target image and the conductive pads in the model image is greater than or equal to a third preset value, determining that connection between the element devices and the conductive pads is qualified; and when a similarity between at least one of the conductive pads in the target image and the conductive pads in the model image is less than the third preset value, determining that a connection imperfect exists between the element devices and the conductive pads.

The above description is merely a summary of the technical solutions of the present application. In order to more clearly know the elements of the present application to enable the implementation according to the contents of the description, and in order to make the above and other purposes, features and advantages of the present application more apparent and understandable, the particular embodiments of the present application are provided below.

BRIEF DESCRIPTION OF THE DRAWINGS

In order to more clearly illustrate the technical solutions of the embodiments of the present application or the related art, the figures that are required to describe the embodiments or the related art will be briefly introduced below. Apparently, the figures that are described below are merely embodiments of the present application, and a person skilled in the art may obtain other figures according to these figures without paying creative work.

DETAILED DESCRIPTION OF THE EMBODIMENTS

Figure 1:
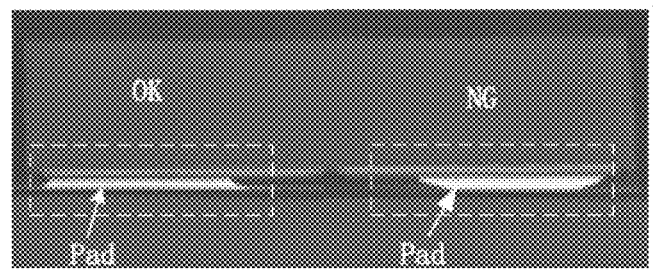
FIG. 1 is an SEM comparison diagram between a qualified soldering and a cold joint between a bonding pad and an element device in the related art of an embodiment of the present application.

The technical solutions of the embodiments of the present application will be clearly and completely described below with reference to the drawings of the embodiments of the present application. Apparently, the described embodiments are merely certain embodiments of the present application, rather than all of the embodiments. All of the other embodiments that a person skilled in the art obtains on the basis of the embodiments of the present application without paying creative work fall within the protection scope of the present application.

In the drawings, in order for clarity, the thicknesses of the areas and the layers may be exaggerated. In the drawings, the same reference numbers represent the same or similar components, and therefore the detailed description on them are omitted. Moreover, the drawings are merely schematic illustrations of the present disclosure, and are not necessarily drawn to scale.

In the embodiments of the present application, unless stated otherwise, the meaning of "plurality of" is "two or more". The terms that indicate orientation or position relations, such as "upper", are based on the orientation or position relations shown in the drawings, and are merely for conveniently describing the present application and simplifying the description, rather than indicating or implying that the component or element must have the specific orientation and be constructed and operated according to the specific orientation. Therefore, they should not be construed as a limitation on the present application.

Unless stated otherwise in the context, throughout the description and the claims, the term "comprise" is interpreted as the meaning of opened containing, i.e., "including but not limited to". In the description of the present disclosure, the terms "one embodiment", "some embodiments", "exemplary embodiments", "example", "specific example" or "some examples" are intended to indicate that specific features, structures, materials or characteristics related to the embodiment or example are comprised in at least one embodiment or example of the present application. The illustrative indication of the above terms does not necessarily refer to the same one embodiment or example. Moreover, the specific features, structures, materials or characteristics may be comprised in any one or more embodiments or examples in any suitable manner.

In the embodiments of the present application, terms such as "first" and "second" are used to distinguish identical items or similar items that have substantially the same functions and effects, merely in order to clearly describe the technical solutions of the embodiments of the present application, and should not be construed as indicating or implying the degrees of importance or implicitly indicating the quantity of the specified technical features.

Currently, both of the Mini LED and the Micro LED light emitting devices are fixed to the base plate by soldering. Regarding the light emitting devices in a light emitting base plate and the light emitting devices in a backlight base plate, if a cold joint or a soldering imperfect happens to one of the light emitting devices, and the defect is not found and repaired in time, in the usage subsequent to the packaging process, that light emitting device is not capable of emitting light, and that base plate may be scraped, which results in a huge loss in the cost. Therefore, quick and accurate detection and timely repairing of a cold joint is an important step of the entire Mini/Micro LED process route in order to ensure the qualified soldering of each of the light emitting devices.

FIG. 1 shows a Scanning Electron Microscope (SEM) image of light emitting devices at the soldering positions in the related art. It may be seen that the soldering between one of the bonding pads (Pad) and one of the solder legs of an element device is qualified (OK), and a cold joint (NG) happens to another bonding pad (Pad) and another solder leg of the element device therebetween.

Figure 2A:
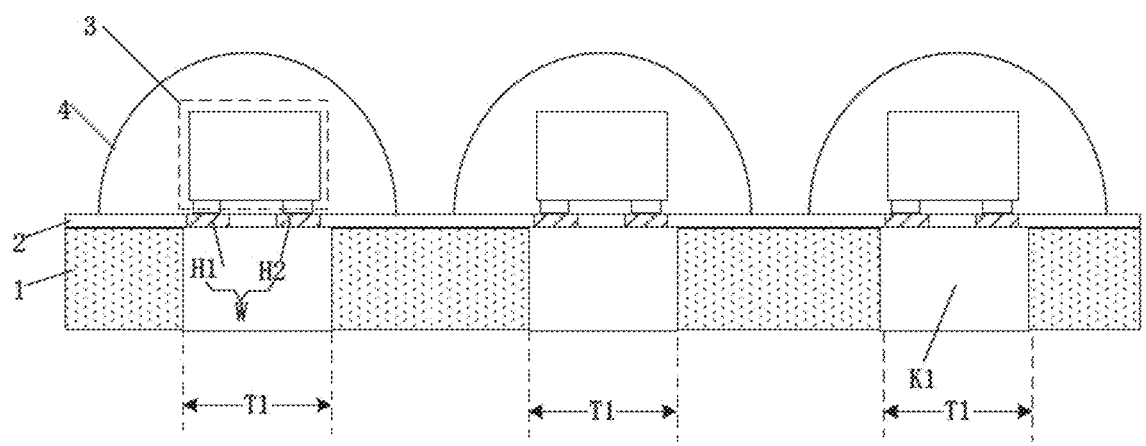
FIG. 2a to 2d are schematic structural diagrams of four different array base plates according to an embodiment of the present application.

In view of that, an embodiment of the present application provides an array base plate. referring to FIG. 2a, the array base plate includes:

A substrate 1, wherein the substrate 1 includes a plurality of first light transmitting areas T1; and A first conductive layer 2 located on the substrate 1;

The first conductive layer includes a plurality of conductive-pad groups W, and each of the conductive-pad groups W includes at least one conductive pad (for example, H1 and H2 in FIG. 2a);

An overlapping area exists between the orthographic-projection area of each of the conductive pads on the substrate 1 and one of the first light transmitting areas T1; and the transmittance of the parts of the substrate 1 that are located at the first light transmitting areas T1 is greater than or equal to a first preset value.

In some embodiments of the present application, the first preset value is greater than or equal to 50%.

In practical applications, the first preset value may include 50%, 55%, 60%, 70%, 80% and 85%, which may particularly be determined according to the designs and the demands on the transmittance of different products, and is not limited herein.

The meaning of an overlapping exists between the orthographic-projection area of each of the conductive pads on the substrate 1 and one of the first light transmitting areas T1 is that the orthographic-projection area of the conductive pad on the substrate 1 and the first light transmitting area T1 at least partially overlap. It may be understood that, if the orthographic-projection area of the conductive pad on the substrate 1 and the first light transmitting area T1 overlap, the size of the overlapping area is not limited herein, and may particularly be determined according to the demands of different products.

Figure 8A:
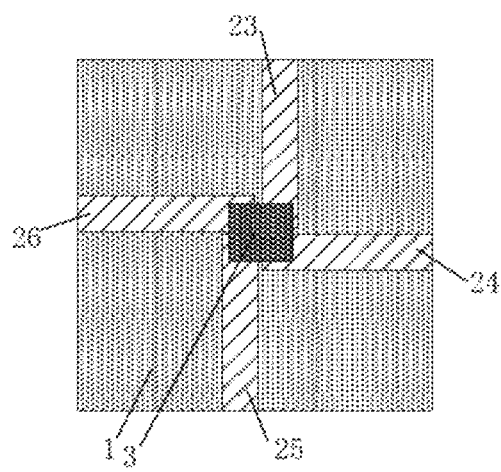
Figure 8B:
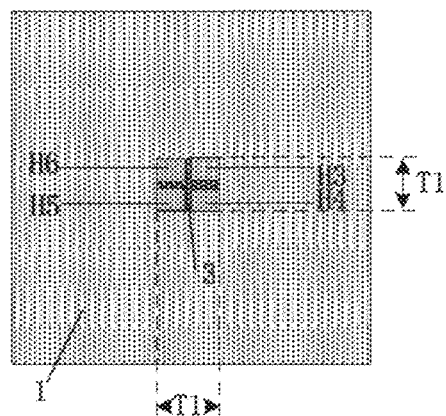

As an example, referring to FIGS. 8a and 8b, the first conductive layer 2 includes an conductive-pad group W. The conductive-pad group W includes a third conductive pad H3, a fourth conductive pad H4, a fifth conductive pad H5 and a sixth conductive pad H6. The orthographic projection area of each conductive pads in the same conductive-pad group W on the substrate 1 overlaps with the same first light transmitting area T1, respectively.

As an example, the conductive pad may be a bonding pad.

In some embodiments of the present application, the area of the overlapping area occupies at least a half of the area of the orthographic-projection area of the conductive pad on the substrate 1.

As an example, 50% of the area of the orthographic projections of the conductive pads on the substrate 1 overlaps with the first light transmitting areas T1; 70% of the area of the orthographic projections of the conductive pads on the substrate 1 overlaps with the first light transmitting areas T1; 90% of the area of the orthographic projections of the conductive pads on the substrate 1 overlaps with the first light transmitting areas T1; or 100% of the area of the orthographic projections of the conductive pads on the substrate 1 overlaps with the first light transmitting areas T1. In this case, the first light transmitting area T1 may expose the back of each of the conductive pads, so as to facilitate to observe the backs of the conductive pads by using a back detecting technique, to determine whether an imperfect problem exists in the conductive pads. In the subsequent process, when the conductive pads and the element devices 3 are being connected, that further facilitates to determine whether a connection imperfect exists between the element devices 3 and the conductive pads by using a back detecting technique.

The connection imperfect includes soldering imperfects, for example, a cold joint, breakage of a conductive pad and corrosion of a conductive pad.

As an example, in the array base plate according to the embodiments of the present application, it may also be a half of the area of the orthographic projection on the substrate 1 of some of the conductive pads overlaps with the first light transmitting area T1, and more than half of the area of the orthographic projection on the substrate 1 of some of the conductive pads overlaps with the first light transmitting area T1, which may be particularly determined according to actual situations.

In practical applications, if the area of the back of each of the conductive pads exposed by the first light transmitting areas T1 is small, then the backs of the conductive pads may not be observed by using a back detecting technique accurately, and, in the subsequent process, when the conductive pads and the element devices 3 are being connected, it may not be accurately determined whether a connection imperfect exists between the element devices 3 and the conductive pads by using a back detecting technique. In the array base plate according to the embodiments of the present application, by configuring that the area of the overlapping area occupies at least a half of the area of the orthographic-projection areas of the conductive pads (for example, H1 and H2 in FIG. 5b) on the substrate 1, the first light transmitting area T1 may expose at least a half of the area of the back of the conductive pad, which increases the accuracy of the determination using a back detecting technique on whether a connection imperfect exists between the element devices 3 and the conductive pads.

Certainly, in practical applications, a few cases may also exist in which, when 30% or 40% of the area of the orthographic projections of the conductive pads on the substrate 1 overlaps with the first light transmitting areas T1, whether a connection imperfect exists between the element devices 3 and the conductive pads may also be determined by using the part of the back of the conductive pad that is exposed by the first light transmitting area T1. However, such cases are rare which do not occur commonly.

The conductive-pad group W includes at least one conductive pad, and FIG. 2a illustrates by taking the case as an example in which the conductive-pad group W includes two conductive pads (H1, H2).

In practical applications, each of the conductive-pad groups W corresponds to one element device 3, and the quantity of the conductive pads included in each of the conductive-pad groups W may be determined according to the quantity of the solder legs included in the element device 3 electrically connected to the conductive-pad group W.

Figure 14A:
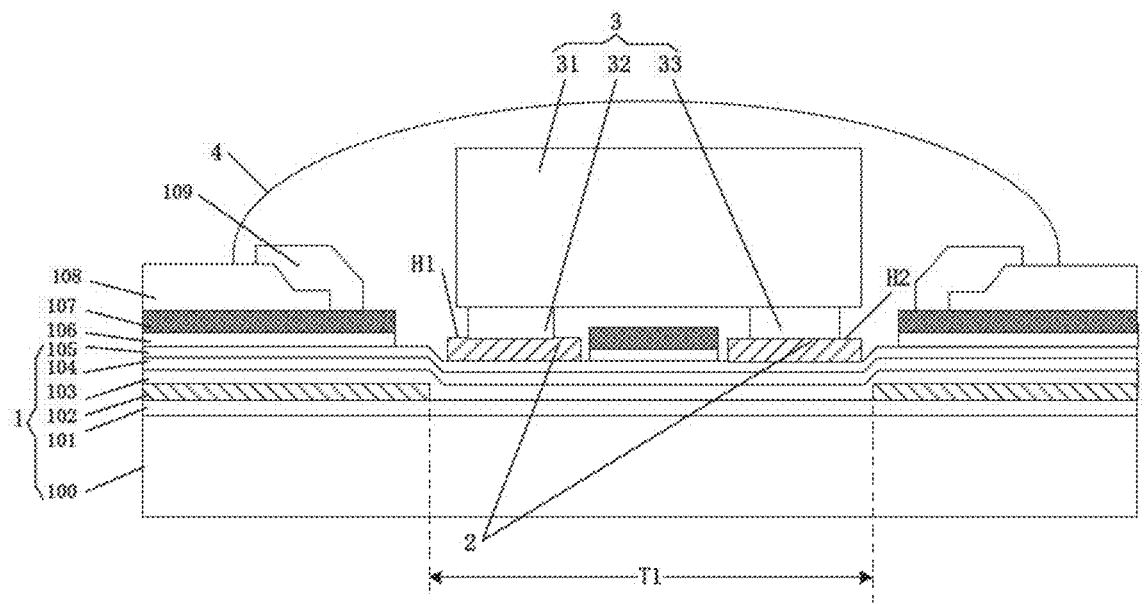
FIG. 14a to 16b are particular schematic structural diagrams of six different array base plates according to an embodiment of the present application.

As an example, referring to FIG. 14a, the element device 3 includes a main element-device body 31, a first solder leg 32 and a second solder leg 33. As corresponding to that, the conductive-pad group W includes a first conductive pad H1 and a second conductive pad H2. The first solder leg 32 is electrically connected to the first conductive pad H1, and the second solder leg 33 is electrically connected to the second conductive pad H2.

The shape of the orthographic projection of the first light transmitting area T1 on the first conductive layer 1 is not limited in the embodiments of the present application. As an example, the shape of the orthographic projection of the first light transmitting area T1 on the first conductive layer 1 may substantially be any one of a strip, a rectangle, a square, a rhombus, a circle, a semicircle and a triangle, and certainly, may also be another shape, which may be particularly configured according to practical demands.

The "may substantially be any one of a strip, a rectangle, a square, a rhombus, a circle, a semicircle and a triangle" refers to that the overall shape of the orthographic projection of the first light transmitting area T1 on the first conductive layer 1 is a strip, a rectangle, a square, a rhombus, a circle, a semicircle or a triangle, but is not limited to standard and regular strip, rectangle, square, rhombus, circle, semicircle and triangle.

Figure 16A:
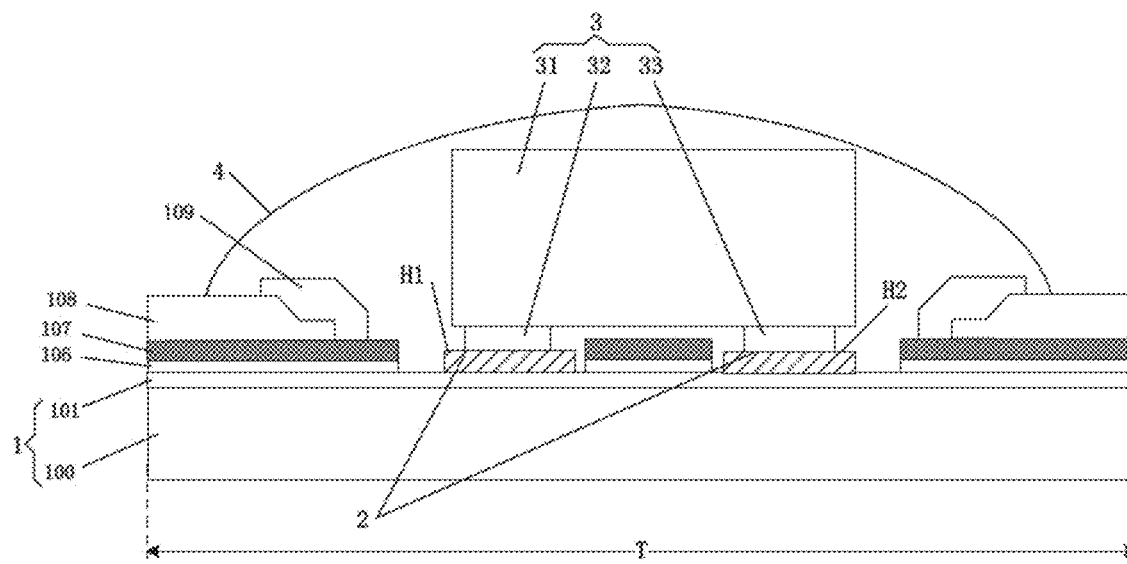

In an exemplary embodiment, the substrate 1 may include a substrate 100, a buffer layer 101, a second conductive layer 102, a first insulating layer 103, a first planarization layer 104 and a second insulating layer 105, as shown in FIG. 14a. Alternatively, the substrate 1 may include a substrate 100 and a buffer layer 101, as shown in FIG. 16a. The particular structure of the substrate 1 may be determined according to actual situations, and is not limited herein.

In an exemplary embodiment, the first conductive layer 2 is used to form an electrically conductive pattern.

In an exemplary embodiment, the conductive pad may be a bonding pad.

In some embodiments, the material of the first conductive layer 2 may include any one of copper, aluminum, nickel, molybdenum and titanium or a combination of some of the metals that are arranged in stack.

As an example, the first conductive layer 2 may include a molybdenum-nickel-titanium alloy (MoNiTi) layer (or molybdenum-niobium alloy layer (MoNb)), a copper metal layer and a copper-nickel alloy (CuNi) layer (or nickel-gold (NiAu) layer) that are sequentially arranged in stack. The molybdenum-nickel-titanium or molybdenum-niobium alloy layer may increase the nucleation density of the copper metal crystal grain in the electroplating process. The copper-nickel alloy or nickel-gold layer serves to prevent oxidation of the copper metal. The nickel-gold layer includes a nickel sublayer and a gold sublayer. In practical applications, the nickel sublayer may be configured to directly contact the copper metal layer, and the gold sublayer may also be configured to directly contact the copper metal layer, which is particularly determined according to actual situations, and is not limited herein.

The range of the thickness of the molybdenum-nickel-titanium alloy layer in the first conductive layer 2 may be 290 Å. For example, the thickness may be 290 Å, 296 Å, 300 Å, 305 Å or 310 Å.

In some embodiments, the range of the thickness of the first conductive layer 2 may be 0.3 µm-10 µm. For example, the thickness may be 0.3 µm, 0.5 µm, 0.6 µm, 0.9 µm, 2.7 µm, 3.6 µm, 4 µm, 4.5 µm, 5 µm, 6.5 µm, 7 µm, 8 µm, 9 µm or 10 µm.

Figure 16B:
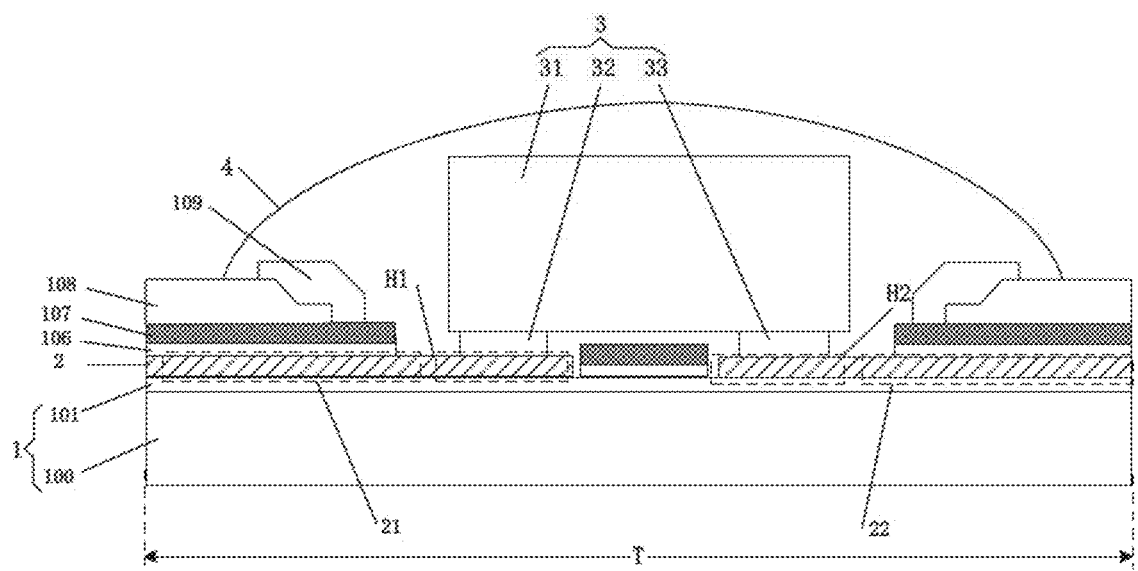

As an example, if there is enough space on the substrate 1 for the arrangement of all of the electrically conductive patterns, the array base plate may include merely one conductive layer, as shown in FIGS. 16a and 16b, in which case the thickness of the first conductive layer 2 may be 2.7 µm, 3.6 µm, 4 µm, 4.5 µm, 5 µm, 6.5 µm, 7 µm, 8 µm, 9 µm or 10 µm.

In the embodiments of the present application, by providing the plurality of first light transmitting areas T1 in the substrate 1, and configuring that the transmittance of the parts of the substrate 1 that are located at the first light transmitting areas T1 is greater than or equal to the first preset value, the backs of the conductive pads in the first conductive layer 2 may be seen from the parts of the substrate 1 that are located at the first light transmitting areas T1, whereby imperfects that may exist in the conductive pads may be detected by using a back detecting technique, to intercept and repair array base plates having an imperfect, thereby improving the reliability of the product.

In some embodiments of the present application, the edge of the conductive pad (for example, H1 and H2 in FIG. 2a) on the substrate 1 is located within the first light transmitting area T1. It may be understood that the area of the orthographic-projection area of the conductive pad on the substrate 1 is less than the area of the first light transmitting area T1. Accordingly, the complete back of the conductive pad may be observed through the first light transmitting area T1, thereby increasing the accuracy of the observation.

In some embodiments of the present application, the material of the parts of the substrate 1 that are located at the first light transmitting areas T1 includes a light transmitting material, and/or, the parts of the substrate 1 that are located at the first light transmitting areas T1 are of a hollow structure.

Figure 2B:
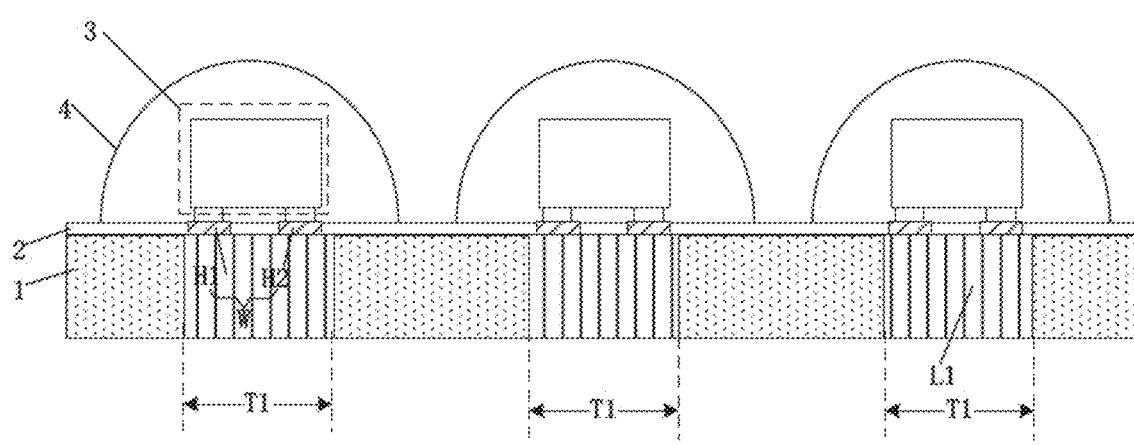

The above solution includes three cases:

In the first case, referring to FIG. 2b, the material of the parts of the substrate 1 that are located at the first light transmitting areas T1 includes a light transmitting material, and in the present application, when the material of the parts of the substrate 1 that are located at the first light transmitting areas T1 include a light transmitting material, the first light transmitting area T1 may be marked as L1.

In the second case, referring to FIG. 2a, the parts of the substrate 1 that are located at the first light transmitting areas T1 are of a hollow structure, and in the present application, when the parts of the substrate 1 that are located at the first light transmitting areas T1 are of a hollow structure, the first light transmitting area T1 may be marked as K1.

Figure 2C:
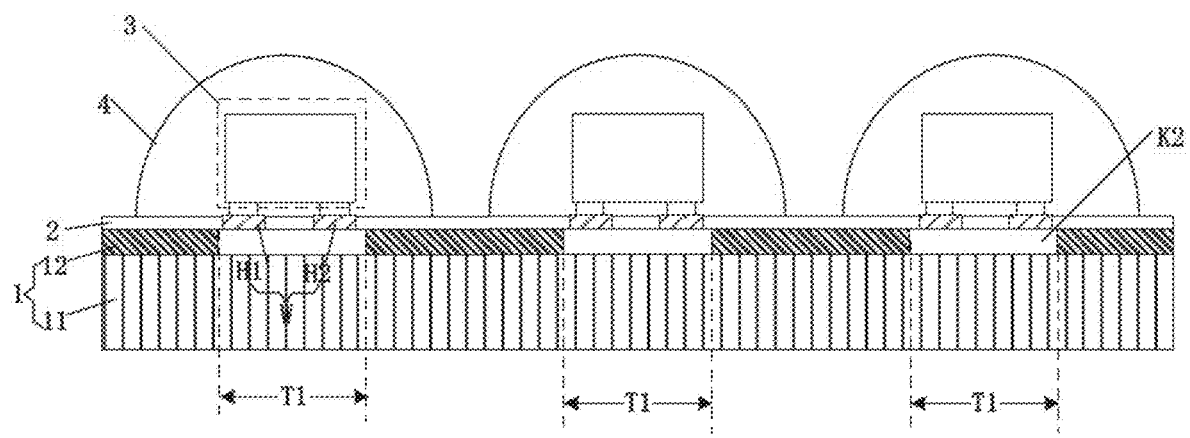

In the third case, referring to FIG. 2c, the material of the parts of the substrate 1 that are located at the first light transmitting areas T1 includes a light transmitting material, and the parts of the substrate 1 that are located at the first light transmitting areas T1 is further of a hollow structure. Particularly, the substrate 1 shown in FIG. 2c includes a light transmitting layer 11 and a light shielding layer 12, the material of the parts of the light transmitting layer 11 that are located at the first light transmitting areas T1 is a light transmitting material, and the parts of the light shielding layer 12 that are located at the first light transmitting areas T1 are of a hollow structure, wherein the hollow structure of the parts of the light shielding layer 12 that are located at the first light transmitting areas T1 is marked as K2. In practical applications, the material of the whole light transmitting layer 11 may be a light transmitting material.

As an example, the light transmitting material may be silica gel, an ultraviolet-light-solidified adhesive, silicon nitride or silicon oxide.

In the embodiments of the present application, by providing the plurality of first light transmitting areas T1 in the substrate 1, and configuring that the transmittance of the parts of the substrate 1 that are located at the first light transmitting areas T1 is greater than or equal to the first preset value, the backs of the conductive pads in the first conductive layer 2 may be seen from the parts of the substrate 1 that are located at the first light transmitting areas T1, whereby imperfects that may exist in the conductive pads may be detected by using a back detecting technique, to intercept and repair array base plates having an imperfect, thereby improving the reliability of the product.

Figure 12:
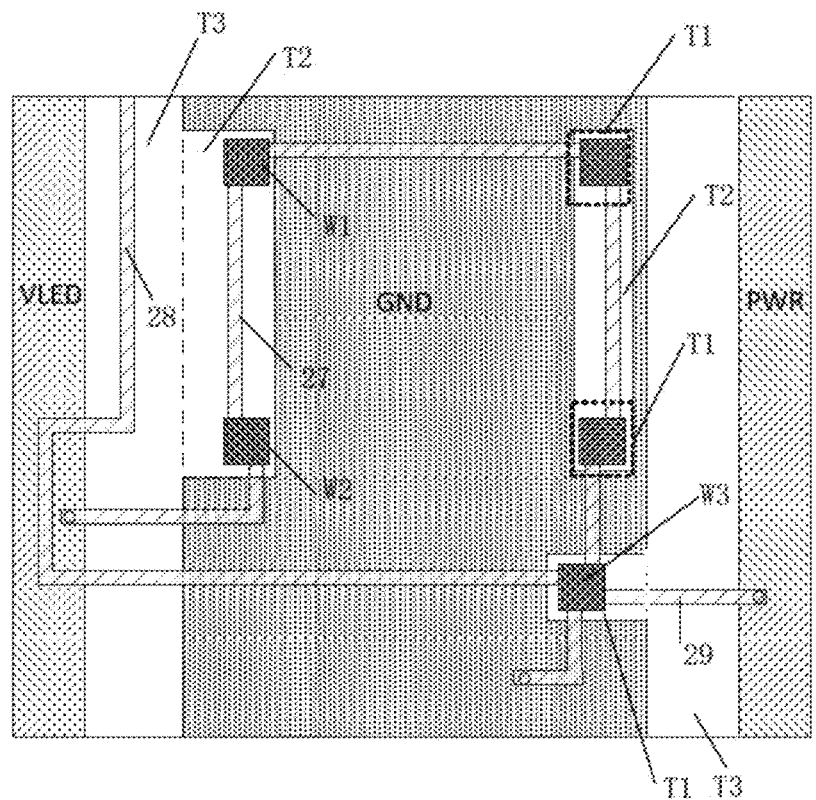
FIG. 12 is a schematic structural diagram of another array base plate according to an embodiment of the present application.

In some embodiments of the present application, referring to FIG. 12, at least two of the first light transmitting areas T1 are communicated and form a second light transmitting area T2.

As an example, referring to FIG. 12, the first conductive layer 2 includes a first conductive-pad group W1, a second conductive-pad group W2 and a seventh trace 27, and the first conductive-pad group W1 and the second conductive-pad group W2 are electrically connected to the seventh trace 27. The orthographic projection of the first conductive-pad group W1 on the substrate 1 is within one first light transmitting area T1, the orthographic projection of the second conductive-pad group W2 on the substrate 1 is within another first light transmitting area T1, and the two first light transmitting areas T1 are communicated to form a second light transmitting area T2, whereby all of the orthographic projections of the first conductive-pad group W1, the second conductive-pad group W2 and the seventh trace 27 on the substrate 1 are within the same one second light transmitting area T2.

In some embodiments, a plurality of first light transmitting areas T1 are communicated, whereby all of the orthographic projections on the substrate 1 of a plurality of conductive-pad groups W and the element devices 3 connected to the conductive-pad groups W are within a second light transmitting area T2 formed by the plurality of first light transmitting areas T1 that are communicated together.

In some embodiments of the present application, referring to FIG. 12, the orthographic-projection areas of some of the conductive-pad groups W on the substrate 1 overlap with the second light transmitting area T2.

In some embodiments of the present application, referring to FIG. 12, the substrate further 1 includes a plurality of third light transmitting areas T3;

the first conductive layer 2 further includes a plurality of traces, and the traces are electrically connected to the conductive pad; and the orthographic-projection areas of at least some of the traces on the substrate 1 overlap with the third light transmitting areas T3.

It should be noted that both of the meanings of the "overlap" and the "have an overlapping area" referred to in the embodiments of the present application are "at least partially overlap".

In some embodiments of the present application, referring to FIG. 12, some of the third light transmitting areas T3 are in communication with some of the first light transmitting areas T1, and/or, some of the third light transmitting areas T3 are in communication with some of the second light transmitting areas T2.

The above solution includes three cases:

In the first case, some of the third light transmitting areas T3 are in communication with some of the first light transmitting areas T1.

Figure 3A:
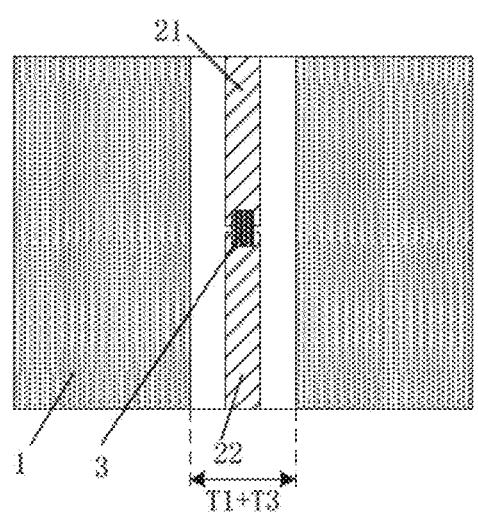
FIG. 3a to 10b are schematic structural diagrams of sixteen array base plates for describing the position relations between the soldering area and the light transmitting area according to an embodiment of the present application.
Figure 3B:
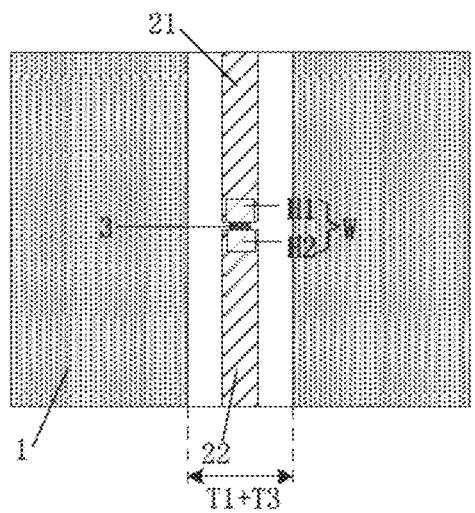

That will be described below with reference to particular embodiments:

1. Referring to FIGS. 3a and 3b, the first conductive layer 2 includes a first trace 21, a second trace 22 and an conductive-pad groups W, and the conductive-pad group W includes a first conductive pad H1 and a second conductive pad H2. In some of the areas of the array base plate, some of the third light transmitting areas T3 are in communication with some of the first light transmitting areas T1, to form the light transmitting area in FIGS. 3a and 3b that is marked as T1+T3 and the projection shape is a rectangle.

Both of the orthographic projections of the first conductive pad H1 and the second conductive pad H2 on the substrate 1 are within the first light transmitting area T1. The orthographic projection of the first trace 21 on the substrate 1 at least partially overlaps with the third light transmitting area T3, and the orthographic projection of the second trace 22 on the substrate 1 at least partially overlaps with the third light transmitting area T3. In addition, when the array base plate includes an element device 3, the orthographic projection of the element device 3 on the substrate 1 is within the first light transmitting area T1.

Figure 4A:
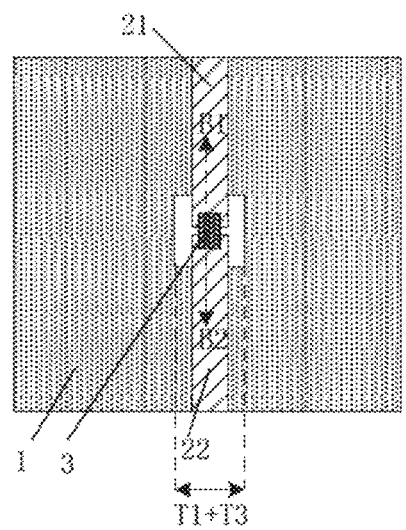
Figure 4B:
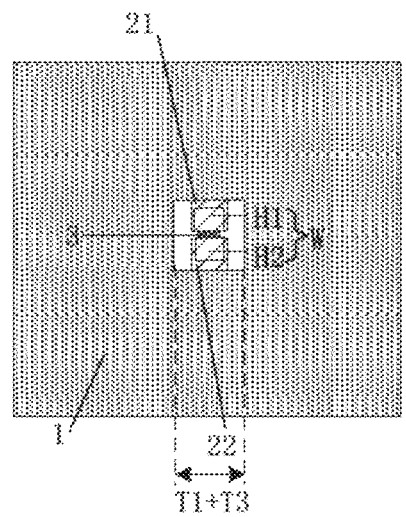

2. Referring to FIGS. 4a and 4b, the first conductive layer 2 includes a first trace 21, a second trace 22 and an conductive-pad groups W, and the conductive-pad group W includes a first conductive pad H1 and a second conductive pad H2. In some of the areas of the array base plate, some of the third light transmitting areas T3 are in communication with some of the first light transmitting areas T1, to form the light transmitting area in FIGS. 4a and 4b that is marked as T1+T3 and the projection shape is a rectangle.

Both of the orthographic projections of the first conductive pad H1 and the second conductive pad H2 on the substrate 1 are within the first light transmitting area T1. The orthographic projection of the first trace 21 on the substrate 1 partially overlaps with the third light transmitting area T3, and the orthographic projection of the second trace 22 on the substrate 1 partially overlaps with the third light transmitting area T3. The orthographic projection of the element device 3 on the substrate 1 is within the first light transmitting area T1.

Figure 5A:
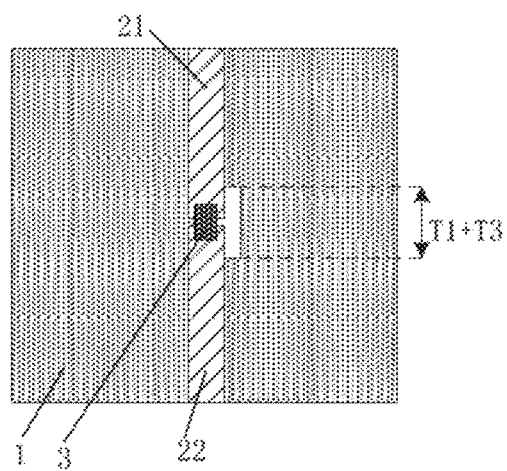
Figure 5B:
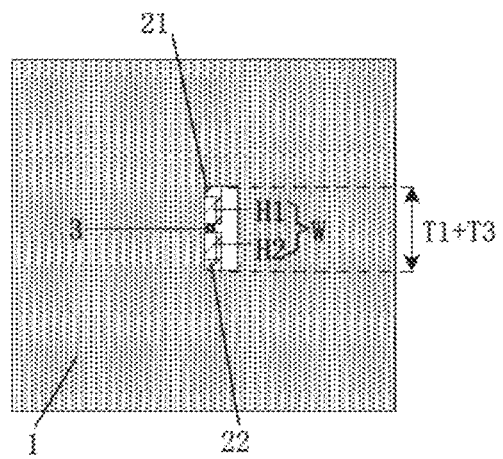

3. Referring to FIGS. 5a and 5b, the first conductive layer 2 includes a first trace 21, a second trace 22 and an conductive-pad groups W, and the conductive-pad group W includes a first conductive pad H1 and a second conductive pad H2. In some of the areas of the array base plate, some of the third light transmitting areas T3 are in communication with some of the first light transmitting areas T1, to form the light transmitting area in FIGS. 5a and 5b that is marked as T1+T3 and the projection shape is a rectangle.

The orthographic projection of the first conductive pad H1 on the substrate 1 partially overlaps with the first light transmitting area T1, and the orthographic projection of the second conductive pad H2 on the substrate 1 partially overlaps with the first light transmitting area T1. The orthographic projection of the first trace 21 on the substrate 1 partially overlaps with the third light transmitting area T3, and the orthographic projection of the second trace 22 on the substrate 1 partially overlaps with the third light transmitting area T3. The orthographic projection of the element device 3 on the substrate 1 partially overlaps with the first light transmitting area T1.

Figure 6A:
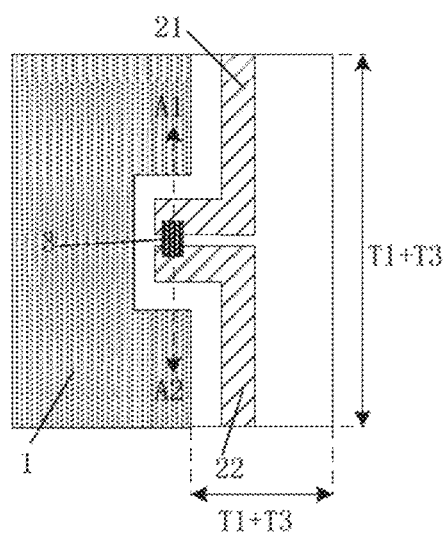
Figure 6B:
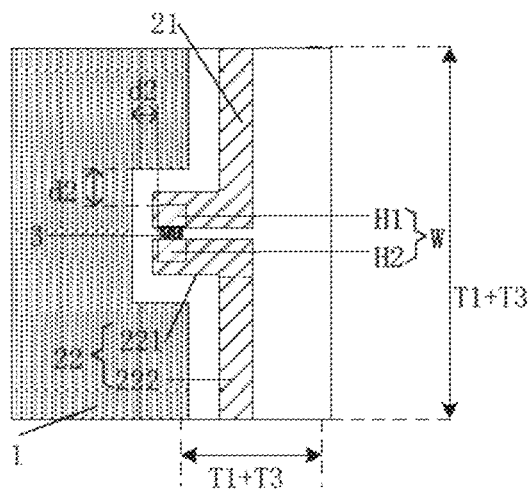

4. Referring to FIGS. 6a and 6b, the first conductive layer 2 includes a first trace 21, a second trace 22 and an conductive-pad groups W, and the conductive-pad group W includes a first conductive pad H1 and a second conductive pad H2. In some of the areas of the array base plate, some of the third light transmitting areas T3 are in communication with some of the first light transmitting areas T1, to form the light transmitting area in FIGS. 6a and 6b that is marked as T1+T3 and the projection shape is a polygon.

Both of the orthographic projections of the first conductive pad H1 and the second conductive pad H2 on the substrate 1 are within the first light transmitting area T1. The orthographic projection of the first trace 21 on the substrate 1 at least partially overlaps with the third light transmitting area T3, and the orthographic projection of the second trace 22 on the substrate 1 at least partially overlaps with the third light transmitting area T3. The orthographic projection of the element device 3 on the substrate 1 is within the first light transmitting area T1.

Figure 7A:
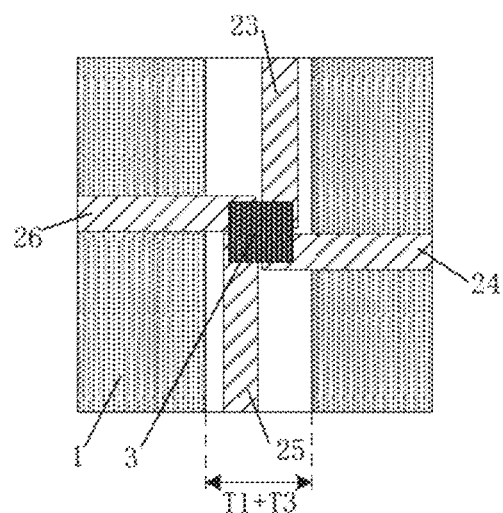
Figure 7B:
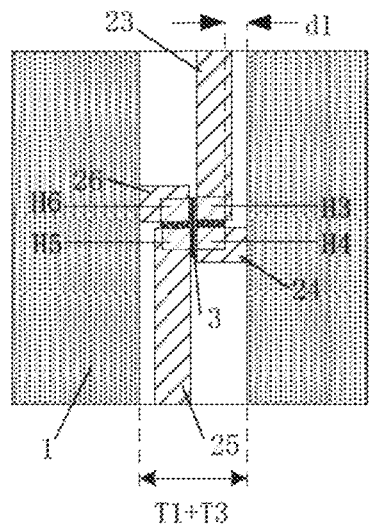

5. Referring to FIGS. 7a and 7b, the first conductive layer 2 includes a third trace 23, a fourth trace 24, a fifth trace 25, a sixth trace 26 and an conductive-pad group W, and the conductive-pad group W includes a third conductive pad H3, a fourth conductive pad H4, a fifth conductive pad H5 and a sixth conductive pad H6. In some of the areas of the array base plate, some of the third light transmitting areas T3 are in communication with some of the first light transmitting areas T1, to form the light transmitting area in FIGS. 7a and 7b that is marked as T1+T3 and has the projection shape of a rectangle.

All of the orthographic projections on the substrate 1 of the third conductive pad H3, the fourth conductive pad H4, the fifth conductive pad H5 and the sixth conductive pad H6 are within the first light transmitting area T1, the orthographic projections of the third trace 23 and the fifth trace 25 on the substrate 1 at least partially overlap with the third light transmitting area T3, respectively, and the orthographic projections of the fourth trace 24 and the sixth trace 26 on the substrate 1 partially overlap with the third light transmitting area T3, respectively. The orthographic projection of the element device 3 on the substrate 1 is within the first light transmitting area T1.

Figure 9A:
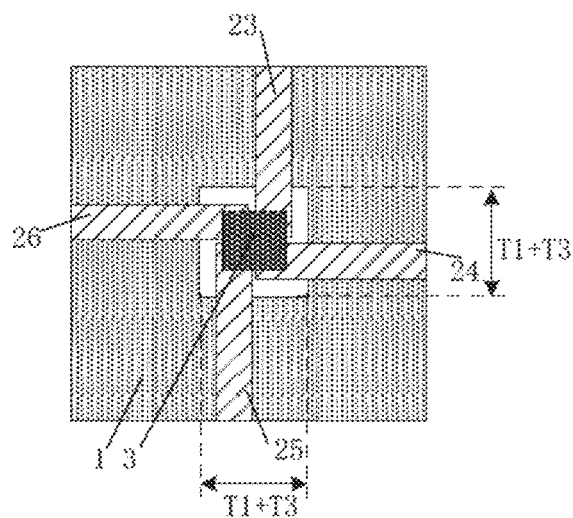
Figure 9B:
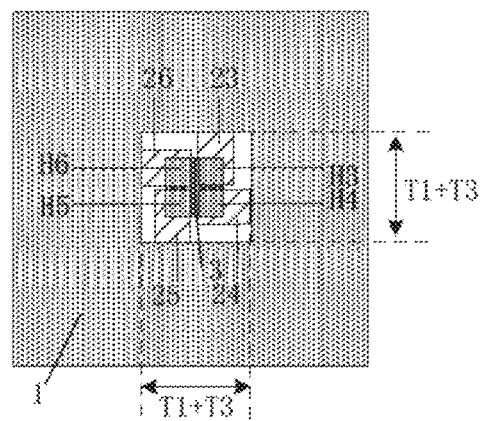

6. Referring to FIGS. 9a and 9b, the first conductive layer 2 includes a third trace 23, a fourth trace 24, a fifth trace 25, a sixth trace 26 and an conductive-pad group W, and the conductive-pad group W includes a third conductive pad H3, a fourth conductive pad H4, a fifth conductive pad H5 and a sixth conductive pad H6. In some of the areas of the array base plate, some of the third light transmitting areas T3 are in communication with some of the first light transmitting areas T1, to form the light transmitting area in FIGS. 9a and 9b that is marked as T1+T3 and the projection shape is a rectangle.

All of the orthographic projections on the substrate 1 of the third conductive pad H3, the fourth conductive pad H4, the fifth conductive pad H5 and the sixth conductive pad H6 are within the first light transmitting area T1, and the orthographic projections on the substrate 1 of the third trace 23, the fourth trace 24, the fifth trace 25 and the sixth trace 26 overlap with the third light transmitting area T3, respectively. The orthographic projection of the element device 3 on the substrate 1 is within the first light transmitting area T1.

Figure 10A:
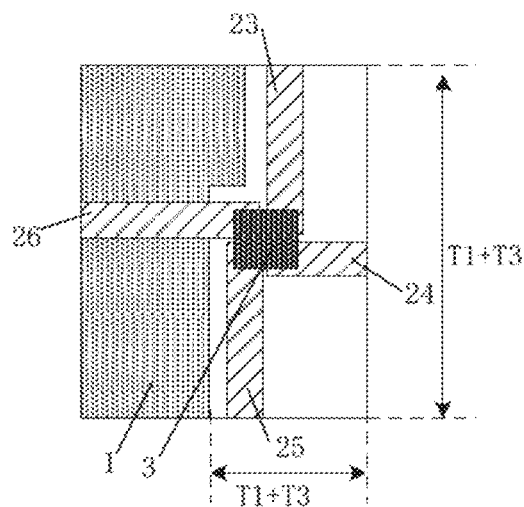
Figure 10B:
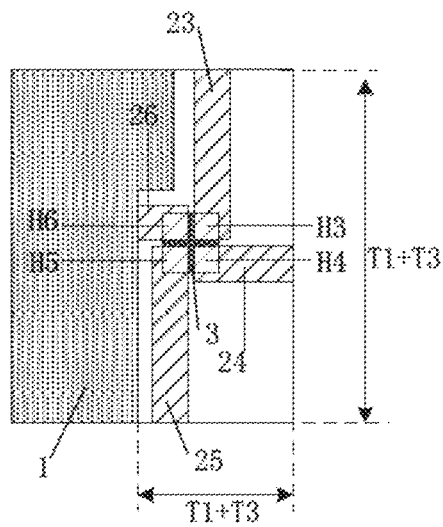

7. Referring to FIGS. 10a and 10b, the first conductive layer 2 includes a third trace 23, a fourth trace 24, a fifth trace 25, a sixth trace 26 and an conductive-pad group W, and the conductive-pad group W includes a third conductive pad H3, a fourth conductive pad H4, a fifth conductive pad H5 and a sixth conductive pad H6. In some of the areas of the array base plate, some of the third light transmitting areas T3 are in communication with some of the first light transmitting areas T1, to form the light transmitting area in FIGS. 10a and 10b that is marked as T1+T3 and the projection shape is a rectangle.

All of the orthographic projections on the substrate 1 of the third conductive pad H3, the fourth conductive pad H4, the fifth conductive pad H5 and the sixth conductive pad H6 are within the first light transmitting area T1.

the orthographic projections on the substrate 1 of the third trace 23, the fourth trace 24 and the fifth trace 25 at least partially overlap with the third light transmitting area T3, respectively. The orthographic projection of the sixth trace 26 on the substrate 1 partially overlaps with the third light transmitting area T3. The orthographic projection of the element device 3 on the substrate 1 is within the first light transmitting area T1.

In some embodiments of the present application, referring to FIGS. 3a-5b, both of the shapes of the projections of the first trace 21 and the second trace 22 on the substrate 1 are a strip shape. Alternatively, referring to FIGS. 6a and 6b, both of the shapes of the projections of the first trace 21 and the second trace 22 on the substrate 1 are an L shape.

It should be noted that the second trace 22 includes a line segment 222 extending in the vertical direction and a line segment 221 extending in the horizontal direction, the structure of the first trace 21 is similar to the structure of the second trace 22, and both of the projection shapes of them are an L shape. In practical applications, both of the first trace 21 and the second trace 22 may include two intersecting line segments, and the intersecting angle thereof may be determined according to actual situations, and is not limited herein.

In the second case, some of the third light transmitting areas T3 are in communication with some of the second light transmitting areas T2.

That will be described below with reference to particular embodiments:

1. Referring to FIG. 12, the second conductive layer 2 includes an eighth trace 28, a first conductive-pad group W1 and a second conductive-pad group W2. In some of the areas of the array base plate, the orthographic projection of the first conductive-pad group W1 on the substrate 1 is within one first light transmitting area T1, the orthographic projection of the second conductive-pad group W2 on the substrate 1 is within another first light transmitting area T1, and the two first light transmitting areas T1 are communicated to form a second light transmitting area T2. The orthographic projection of the eighth trace 28 on the substrate 1 is within the third light transmitting area T3, and the third light transmitting area T3 is in communication with the second light transmitting area T2.

In the third case, some of the third light transmitting areas T3 are in communication with some of the first light transmitting areas T1, and some of the third light transmitting areas T3 are in communication with some of the second light transmitting areas T2.

That will be described below with reference to particular embodiments:

1. Referring to FIG. 12, in some of the areas of the array base plate, the orthographic projection of the first conductive-pad group W1 on the substrate 1 is within one first light transmitting area T1, the orthographic projection of the second conductive-pad group W2 on the substrate 1 is within another first light transmitting area T1, and the two first light transmitting areas T1 are communicated to form a second light transmitting area T2. The orthographic projection of the eighth trace 28 on the substrate 1 partially overlaps with the third light transmitting area T3, and the third light transmitting area T3 is in communication with the second light transmitting area T2.

In some of the areas of the array base plate, the orthographic projection of a third conductive-pad group W3 on the substrate 1 is within one first light transmitting area T1, and the orthographic projection of a ninth trace 29 on the substrate 1 partially overlaps with the third light transmitting area T3. The first light transmitting area T1 is in communication with the third light transmitting area T3.

In the embodiments of the present application, by configuring that some of the third light transmitting areas T3 are in communication with some of the first light transmitting areas T1, and/or, Some of the third light transmitting areas T3 are in communication with some of the second light transmitting areas T2, the light transmitting areas may be fabricated to have a large size, which prevents the problem of a high difficulty in the manufacturing process caused by a too small size of the light transmitting areas.

It should be noted that, in the embodiments of the present application, FIG. 3a, FIG. 4a, FIG. 5a, FIG. 6a, FIG. 7a, FIG. 8a, FIG. 9a and FIG. 10a are eight front views of the array base plate. FIG. 3b is a back view corresponding to FIG. 3a. FIG. 4b is a back view corresponding to FIG. 4a. FIG. 5b is a back view corresponding to FIG. 5a. FIG. 6b is a back view corresponding to FIG. 6a. FIG. 7b is a back view corresponding to FIG. 7a. FIG. 8b is a back view corresponding to FIG. 8a. FIG. 9b is a back view corresponding to FIG. 9a. FIG. 10b is a back view corresponding to FIG. 10a.

In some embodiments, through the light transmitting area, not only at least part of the area of the back of the conductive pad may be exposed, but also other components at the periphery of the conductive pad may be exposed. As an example, the other components mentioned above may include traces, driving lines or the element device 3 that are connected to the conductive pad.

Figure 2D:
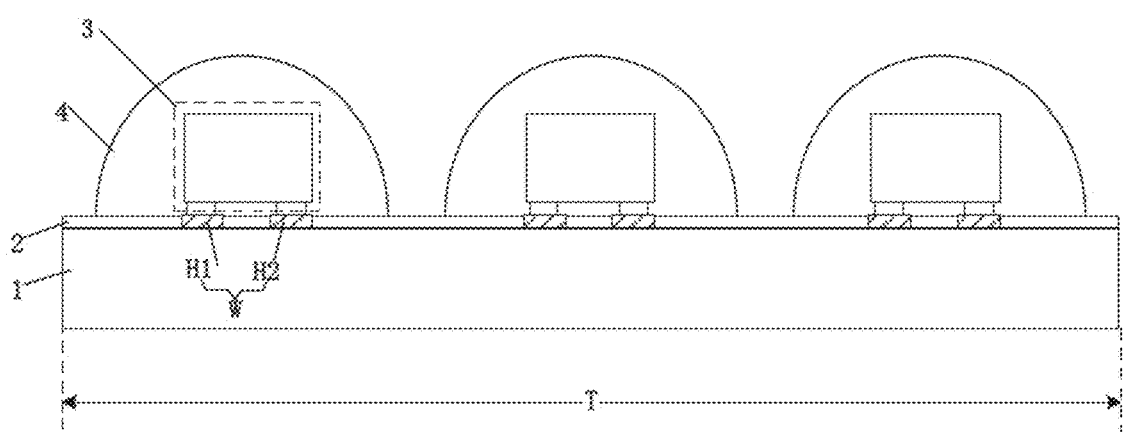

In some embodiments, referring to FIG. 2d, all of the small-sized light transmitting areas are connected together to form a full-face light transmitting area T. It may be understood that all of the film layers in such a substrate 1 are fabricated by using a light transmitting material.

In some embodiments, if there is no enough space on substrate 1 for the arrangement of all of the electrically conductive patterns, the array base plate may include two conductive layers shown in FIGS. 14a, 14b, 15a and 15b, and the first conductive layer 2 and the second conductive layer 102 (or 1021) together form the electrically conductive pattern. The first conductive layer 2 is closer to the element device 3 than the second conductive layer 102 (or 1021), in which case the thickness of the first conductive layer 2 may be 0.3 µm, 0.5 µm, 0.6 µm or 0.9 µm, 2.7 µm, 3.6 µm, 5 µm.

In some embodiments of the present application, referring to FIG. 12, the substrate 1 includes a bottom layer 100 and a second conductive layer 102 located on the bottom layer 100, and the second conductive layer 102 is insulated from the first conductive layer 2.

The first conductive layer 2 and the second conductive layer 102 (or 1021) together form the electrically conductive pattern, wherein the first conductive layer 2 includes a plurality of traces, which are used to transmit the received electric signals to the element devices 3.

The second conductive layer 102 includes a plurality of driving lines that are arranged in a first direction and extend in a second direction. The orthographic projection of the third light transmitting area T3 on the bottom layer 100 is within the area between the orthographic projections of two neighboring driving lines on the bottom layer 100.

As an example, referring to FIG. 12, the driving lines may include a first driving line (VLED), a second driving line (GND) and a third driving line (PWR).

In some embodiments of the present application, referring to FIG. 12, at least some of the third light transmitting areas T3 are arranged in the first direction, and extend in the second direction.

The first direction may be the vertical direction or a column direction, and the second direction may be the horizontal direction or a row direction. Certainly, the first direction may also be the horizontal direction or a row direction, and the second direction may also be the vertical direction or a column direction.

In some embodiments, the material of the second conductive layer 102 (or 1021) may include any one of copper, aluminum, nickel, molybdenum and titanium or a combination of some of the metals that are arranged in stack.

In some embodiments, the second conductive layer 102 (or 1021) may include a molybdenum-niobium alloy layer, a copper metal layer and a protecting layer that are sequentially arranged in stack, and the protecting layer may include any one of a copper-nickel alloy (CuNi), a nickel-gold layer and Indium Tin Oxide (referred to for short as ITO). The molybdenum-niobium alloy layer serves to increase the adhesive force between the copper metal and the film layer on the side closer to the substrate. The protecting layer serves to prevent oxidation of the copper metal.

As an example, the thickness of the second conductive layer 102 (or 1021) may range 0.5-10 μm. For example, the thickness may be 0.5 μm, 1 μm, 1.8 μm, 2.7 μm or 10 μm.

In some embodiments, the material of the second conductive layer 102 (or 1021) may include a light transmitting material, for example, Indium Tin Oxide (ITO).

Figure 14B:
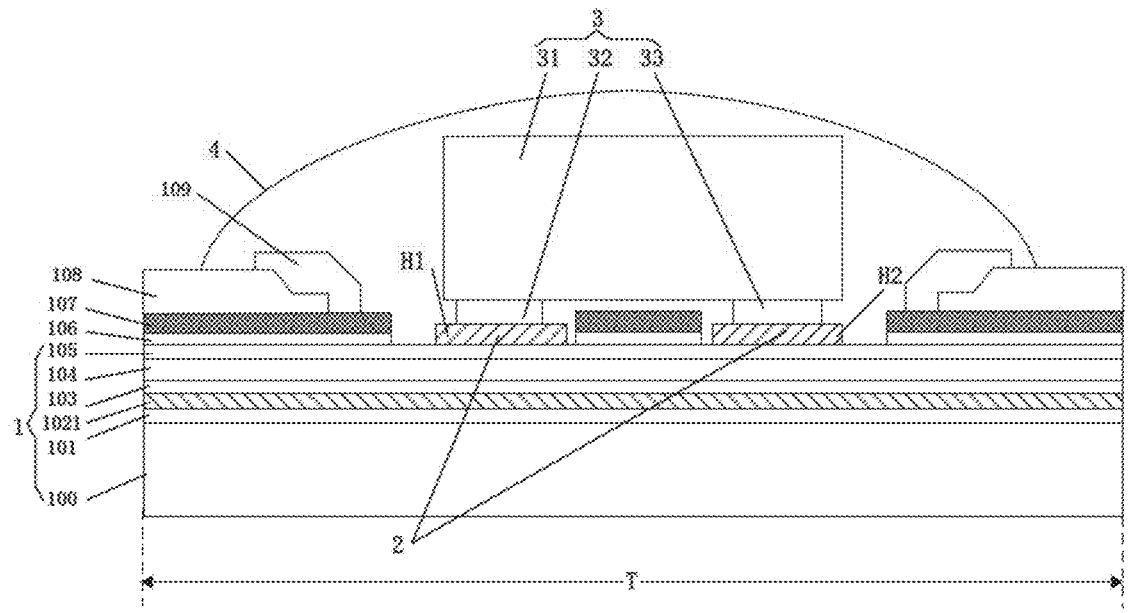
Figure 15A:
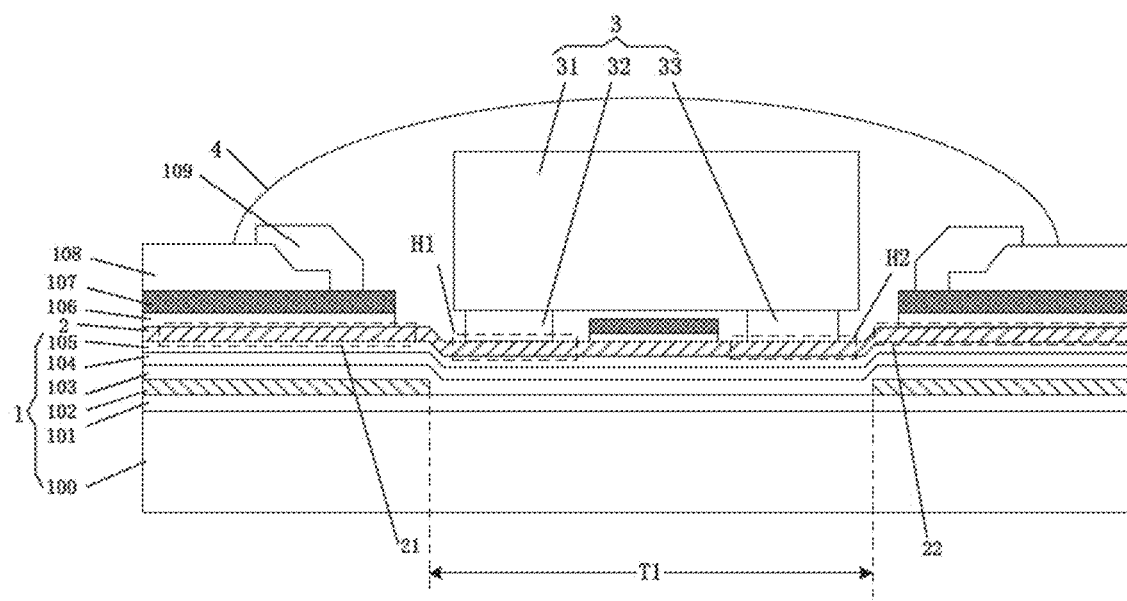
Figure 15B:
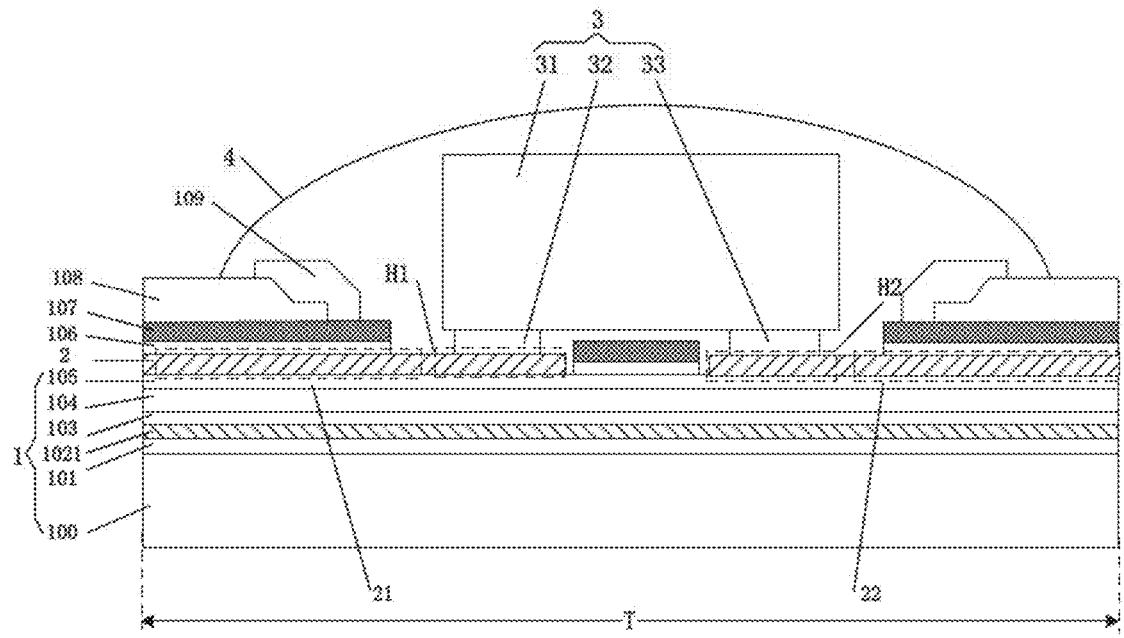

It should be noted that, in the embodiments of the present application, when the material of the second conductive layer is not transparent, the second conductive layer is marked as 102, for example, the mark in FIGS. 14a and 15a, and when the material of the second conductive layer is transparent, the second conductive layer is marked as 1021, for example, the mark in FIGS. 14b and 15b.

In some embodiments of the present application, the distance from the contour of the orthographic projection of the light transmitting area T on the first conductive layer 2 to the conductive pad ranges 0-200 μm.

As an example, the light transmitting area T may include any one or more of the first light transmitting area T1, the second light transmitting area T2 and the third light transmitting area T3. The material of the parts of the substrate 1 that are located at the light transmitting areas T includes a light transmitting material, and/or, the parts of the substrate 1 that are located at the light transmitting areas T are of a hollow structure.

The light transmitting area T referred to throughout the present application refers to any one of the first light transmitting areas T1, the second light transmitting areas T2 and the third light transmitting areas T3, or an area that is formed by communicating two or more of the first light transmitting areas T1, the second light transmitting areas T2 and the third light transmitting areas T3.

The orthographic-projection areas on the substrate 1 of the first light transmitting area T1 and the conductive pad overlap. At least two first light transmitting areas T1 are communicated to form one second light transmitting area T2. The orthographic-projection areas of the third light transmitting area T3 and some of the traces on the substrate 1 overlap.

As an example, if the contour of the projection of the light transmitting area T on the first conductive layer 2 and the outer contour of the conductive pad coincide, the distance from the contour of the orthographic projection of the light transmitting area T on the first conductive layer 2 to the conductive pad is 0 μm.

As an example, if the contour of the projection of the light transmitting area T on the first conductive layer 2 encircles the outer contour of the conductive pad, the distance from the contour of the orthographic projection of the light transmitting area T on the first conductive layer 2 to the conductive pad is greater than 0 μm, and less than or equal to 200 μm.

In some embodiments, referring to FIG. 7b, the contour of the orthographic projection of the light transmitting area (T1+T3) on the first conductive layer 2 encircles the outer contour of the third conductive pad H3, and the direct distance d1 from the contour of the orthographic projection of the light transmitting area on the first conductive layer 2 to the third conductive pad H3 is greater than 0 μm, and less than or equal to 200 μm. For example, d1 may be 10 μm, 30 μm, 50 μm, 100 μm, 150 μm or 200 μm.

In some embodiments, referring to FIG. 6b, the contour of the orthographic projection of the light transmitting area (T1+T3) on the first conductive layer 2 encircles the outer contour of the first conductive pad H1. The distance d2 in the horizontal direction from the contour of the orthographic projection of the light transmitting area on the first conductive layer 2 to the first conductive pad H1 is greater than 0 μm, and less than or equal to 200 μm. The distance d2 in the vertical direction from the contour of the orthographic projection of the light transmitting area on the first conductive layer 2 to the first conductive pad H1 is greater than 0 μm, and less than or equal to 200 μm.

In some embodiments of the present application, the array base plate further includes a plurality of element devices 3, and each of the element devices 3 is electrically connected to the same one conductive-pad group W.

In an exemplary embodiment, the element devices 3 may include any one or more of a light emitting device, a sensing device, a mini-sized driving chip and other types of devices. It may be understood that the quantities of different types of the devices are different, and the densities of the array arrangement of different types of the devices are different.

The light emitting device may be a Mini Light Emitting Diode (abbreviated as Mini LED) or a Micro Light Emitting Diode (abbreviated as Micro LED), which is not limited herein.

As an example, all of the plurality of element devices 3 may be Mini Light Emitting Diodes or Micro Light Emitting Diodes emitting a blue light. Alternatively, the plurality of element devices 3 may include all of light emitting diodes or micro light emitting diodes emitting a red light, emitting a green light and emitting a blue light.

As an example, one element device 3 may include at least one solder leg, one conductive-pad group W may include at least one conductive pad, and the solder leg of the element device 3 is electrically connected to the conductive pad of the conductive-pad group W. In practical applications, an element device 3 comprising 3 solder legs may be electrically connected to an conductive-pad group W including 2 conductive pads. It may be understood that one element device 3 corresponds to one conductive-pad group W. However, the quantity of the solder legs of the element device 3 may be equal to the quantity of the conductive pads in the conductive-pad group W, or the quantity of the solder legs of the element device 3 may be unequal to the quantity of the conductive pads in the conductive-pad group W, which may be particularly determined according to actual situations.

All of the embodiments of the present application illustrate by taking the case as an example in which the quantity of the solder legs of the element device 3 is equal to the quantity of the conductive pads in the conductive-pad group W.

Figure 11A:
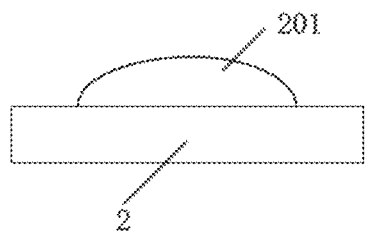
FIG. 11a to 11c are schematic diagrams of the principle of the formation of the connecting layer according to an embodiment of the present application.
Figure 11B:
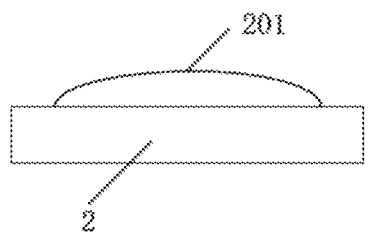
Figure 11C:
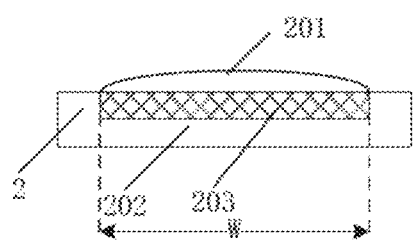

In some embodiments of the present application, a plurality of the conductive-pad groups W are arranged in an array, and, referring to FIG. 11c, each of the conductive pads includes a metal layer 202 and a connecting layer 203 located on the metal layer 202.

Figure 11D:
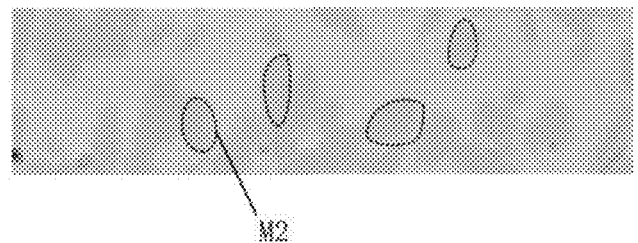
FIG. 11d to 11e are schematic diagrams of two characteristic morphologies of the connecting layer according to an embodiment of the present application.
Figure 11E:
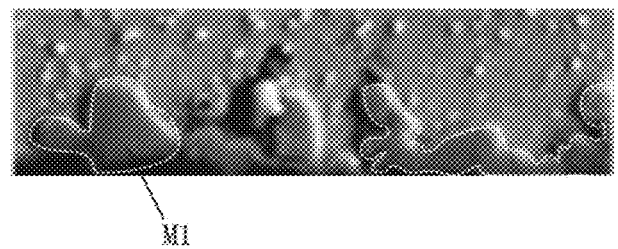

The connecting layer 203 is located between the metal layer 202 and the element device 3, and the metal layer 202 is connected to the element device 3 by the connecting layer 203. The connecting layer 203 includes an intermetallic compound (IMC, Intermetallic compound), and the morphology of the intermetallic compound is at least one of a block structure M1, a conchoid structure and a dendriform structure, as shown in FIG. 11e, and a rice-granular structure M2, as shown in FIG. 11d.

In some embodiments, the soldering layer 201 shown in FIG. 11a is printed on the first conductive layer 2. Referring to FIG. 11b, the soldering layer 201 is melted and spread by heating. The melted soldering layer 201 wets part of the area of the first conductive layer 2, and spreads with the material of the first conductive layer 2. During the process of the reflow soldering, the connecting layer 203 shown in FIG. 11c is formed at the interface between the soldering layer 201 and the first conductive layer 2.

In some embodiments of the present application, the intermetallic compound includes any one or more of $Cu_6Sn_5$, $Cu_3Sn$, $Ni_3Sn_4$, $(Cu,Ni)_6Sn_5$, $(Ni,Cu)_3Sn_4$ and $Ag_3Sn$.

$(Cu,Ni)_6Sn_5$ is a material with $Cu_6Sn_5$ as the principal component, in which the copper (Cu) atom in part of the $Cu_6Sn_5$ is replaced by a nickel (Ni) atom. In which the nickel (Ni) atom in part of the $Ni_3Sn_4$ is replaced by a copper (Cu) atom. As an example, the material of the metal layer 202 includes copper (Cu), and the material of the soldering layer 201 includes SnAg or SnAgCu.

In some embodiments, the soldering layer 201 may be pre-prepared on the solder legs of the element device 3, and may also be printed onto the conductive pads.

In some embodiments, in order to observe the morphology of the intermetallic compound of the connecting layer 203 through the light transmitting area in the detection from the back, to determine whether a connection imperfect exists between the conductive pads and the element devices, the thickness of the conductive pad (or the first conductive layer 2) in the direction perpendicular to the substrate 1 may range 0.3 µm-5 µm. In this case, thickness of the metal layer 202 is low, and does not block the morphology of the intermetallic compound in the connecting layer 203, which facilitates the user to determine the condition of the connection between the element devices 3 and the conductive pads accurately by using a back detecting technique.

As an example, the thickness of the conductive pad (or the first conductive layer 2) in the direction perpendicular to the substrate 1 may be 0.3 µm, 0.5 µm, 0.6 µm, 0.7 µm, 0.8 µm, 0.9 µm, 1.0 µm, 1.5 µm, 1.8 µm, 2.0 µm, 2.5 µm, 2.7 µm, 3.6 µm, 4.5 µm or 5 µm.

In some embodiments of the present application, the array base plate further includes a soldering layer, the soldering layer is located between solder legs of each of the element devices and the conductive pad, and the soldering layer includes a soldering material; and if the soldering layer and the conductive pad directly contact, the morphology of the intermetallic compound (IMC) is the rice-granular structure M2 shown in FIG. 11d.

In some embodiments of the present application, the array base plate further includes a soldering layer, the soldering layer is located between solder legs of each of the element devices and the conductive pad, and the soldering layer includes a soldering material; and if an inhibiting layer is arranged between the soldering layer and the conductive pad, the morphology of the intermetallic compound (IMC) is one or more of the block structure M1, the conchoid structure and the dendriform structure shown in FIG. 11e.

As an example, the soldering material may be a tin solder.

As an example, the material of the inhibiting layer includes nickel (Ni) and/or gold (Au).

It should be noted that the rice-granular structure M2 presented by the intermetallic compound (IMC) is related to the processes of the crystal growth of the soldering material and the material of the second conductive layer, and the block structure M1 presented by the intermetallic compound (IMC) is related to the processes of the crystal growth of the soldering material, the material of the second conductive layer and the material of the inhibiting layer. The reason is that, in the above two situations, the forms of crystals generated in the connecting layer 203 are different, and/or the sizes of the crystals are different, the intermetallic compounds (IMC) in the formed connecting layers 203 present different morphologies and structures.

It should also be noted that, in practical applications, the block structure may be the gap formed between some of the areas of the connecting layer 203 and some of the areas of the metal layer 202, whereby the hollow block structure is presented in the X-ray image. Alternatively, it may also be a crystal aggregation formed by the intermetallic compound in the connecting layer 203, whereby the block structure M1 shown in FIG. 11e may also be presented in the microscope.

In some embodiments of the present application, referring to FIG. 14a, the array base plate includes two conductive layers (the first conductive layer 2 and the second conductive layer 102), and the first conductive layer 2 and the second conductive layer 102 together form the electrically conductive pattern.

Particularly, the substrate 1 includes a bottom layer 100, and a buffer layer 101, a second conductive layer 102, a first insulating layer 103, a first planarization layer 104 and a second insulating layer 105 that are located on the bottom layer 100 and are sequentially arranged in stack. All of the materials of the buffer layer 101, the first insulating layer 103, the first planarization layer 104 and the second insulating layer 105 are a light transmitting material. The material of the parts of the second conductive layer 102 that are located at the light transmitting areas T is a light transmitting material, or, the parts of the second conductive layer 102 that are located at the light transmitting areas T are of a hollow structure.

As an example, in the array base plate shown in FIGS. 14a and 15a, all of the materials of the film layers in the substrate 1 other than the second conductive layer 102 are a light transmitting material, and the parts of the second conductive layer 102 that are located at the light transmitting areas T are of a hollow structure. It should be noted that the array base plate shown in FIG. 14a is a cross-sectional view along A1A2 in FIG. 6a. The array base plate shown in FIG. 15a is a cross-sectional view along B1B2 in FIG. 4a.

As an example, referring to FIGS. 14b and 15b, all of the materials of the film layers in the substrate 1 are a light transmitting material.

In some embodiments of the present application, referring to FIGS. 16a and 16b, the substrate 1 includes a substrate 100 and a buffer layer 101, the array base plate includes merely one conductive layer (the first conductive layer 2), and the first conductive layer 2 is used to form an electrically conductive pattern.

As an example, referring to FIGS. 16a and 16b, all of the materials of the film layers in the substrate 1 are a light transmitting material.

In some embodiments, referring to FIGS. 14a-16b, the array base plate further includes a third insulating layer 106 and a second planarization layer 107 that are located on the first conductive layer 2, wherein the orthographic projections of the third insulating layer 106 and the second planarization layer 107 on the substrate 1 do not overlap with the orthographic projection of the conductive-pad group W on the substrate 1. The third insulating layer 106 and the second planarization layer 107 are provided with an opening area, the opening area exposes the area of the conductive-pad group W, and the element device 3 is located in the opening area and is electrically connected to the conductive-pad group W.

In some embodiments, referring to FIGS. 14a-16b, the array base plate further includes a reflecting layer 108, the reflecting layer 108 is located at the area of the second planarization layer 107 other than the opening area, the orthographic projection of the reflecting layer 108 on the substrate 1 does not overlap with the orthographic projection of the element device 3 on the substrate 1, and the orthographic projection of the reflecting layer 108 on the substrate 1 is located within the orthographic projection of the second planarization layer 107 on the substrate 1.

The provision of the reflecting layer 108 may increase the light-emission amount of the array base plate in the direction perpendicular to the plane where the substrate 1 is located, thereby increasing the luminous efficiency of the array base plate. It should be noted that, in this case, the element device 3 includes at least a light emitting device.

As an example, the material of the reflecting layer 108 may include any one or more of a white ink, a silicon-type white glue and a reflector plate.

In some embodiments, the array base plate further includes an auxiliary reflecting unit 109, the auxiliary reflecting unit 109 is located at a side wall of the reflecting layer 108 that is closer to the element device 3, and the orthographic projection of the auxiliary reflecting unit 109 on the substrate 1 partially overlaps with the orthographic projection of the reflecting layer 108 on the substrate 1. Accordingly, by the combined action of the reflecting layer 108 and the auxiliary reflecting unit 109, the light-emission amount of the array base plate in the direction perpendicular to the plane where the substrate 1 is located may be further increased, thereby increasing the luminous efficiency of the array base plate.

The material of the auxiliary reflecting unit 109 includes a silicon-type white glue. The color of the silicon-type white glue is white, which enables the color of the auxiliary reflecting unit 109 to be substantially the same as the color of the reflecting layer 108, to ensure that the reflectivity of the auxiliary reflecting unit 109 to light rays is close to the reflectivity of the reflecting layer 108 to light rays.

In some embodiments, the array base plate further includes a plurality of encapsulation units 4 corresponding to the element devices 3, the orthographic projection of the encapsulation unit 4 on the substrate 1 covers the orthographic projection of the element device 3 on the substrate 1, and the orthographic projection of the encapsulation unit 4 on the substrate 1 partially overlaps with the orthographic projection of the reflecting layer 108 on the substrate 1.

As an example, referring to FIGS. 16a and 16b, each of the encapsulation units 4 wraps one element device 3. The encapsulation unit 4 does not only used to seal and protect the element device 3, but also the shape of its surface away from the substrate 1 may be configured, for example, to enable its surface to be like a convex lens, whereby the light exiting angle of the light emitting device included in the element device 3 may be further regulated.

Figure 17:
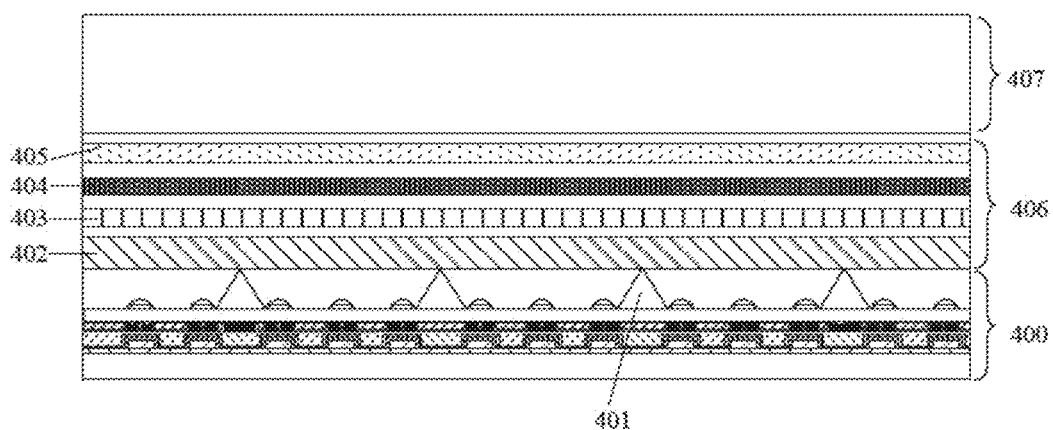
FIG. 17 is a schematic structural diagram of the displaying device according to an embodiment of the present application.

In another aspect, an embodiment of the present application provides a light emitting apparatus. Referring to FIG. 17, the light emitting apparatus includes the array base plate 400 stated above.

The light emitting apparatus may be used as a backlight device, and may also be used as a displaying device. Particularly, if the plurality of element devices 3 in the light emitting apparatus include light emitting devices that emit lights of a single color, then the light emitting apparatus may be used as a backlight device. If the plurality of element devices 3 in the light emitting apparatus include light emitting devices that emit lights of different colors, for example, three types of the light emitting devices emitting a red light, emitting a green light and emitting a blue light, then the light emitting apparatus may be used as a displaying device.

In some embodiments, the array base plate further includes a light emitting film 406.

In some embodiments, the array base plate further includes a plurality of supporting pillars 401, the plurality of supporting pillars 401 are used to support the plurality of optical films 406, and each of the optical films 406 includes a diffusing plate 402, a quantum-dot film 403, a diffusing sheet 404 and a composite film 405 that are sequentially arranged in the direction further away from the array base plate 400. The diffusing plate 402 and the diffusing sheet 404 may ameliorate the lamp shadow generated by the array base plate, to improve the displaying image quality of the light emitting apparatus. The quantum-dot film 403, by the excitation by the blue light emitted by the light emitting devices in the array base plate, converts the blue light into a white light, which may increase the utilization ratio of the light energy of the array base plate 400. The composite film 405 is used to increase the brightness of the light rays exiting the diffusing sheet 404.

The embodiments of the present application illustrate by taking the case as an example in which the plurality of element devices 3 in the light emitting apparatus include light emitting devices that emit lights of a single color and the light emitting apparatus may be used as a backlight device. In this case, a display panel 407 is provided on the light exiting side of the light emitting apparatus, which may form the displaying device shown in FIG. 17.

In the light emitting apparatus according to the present application, by providing the plurality of first light transmitting areas T1 in the substrate 1, and configuring that each of the first light transmitting areas T1 includes a light transmitting material and/or a hollow structure, because the transmittance of the parts of the substrate 1 that are located at the first light transmitting areas T1 is greater than or equal to a first preset value, some of the areas of the backs of the conductive pads may be seen from the parts of the substrate 1 that are located at the first light transmitting areas T1, whereby imperfects of the conductive pads may be directly determined by using a back detecting technique. After the manufacturing of the element devices 3 are completed, connection imperfects between the conductive pads and the element devices 3 may also be directly determined by using a back detecting technique, to intercept and repair array base plates having a connection imperfect, thereby improving the reliability of the product.

Figure 18:
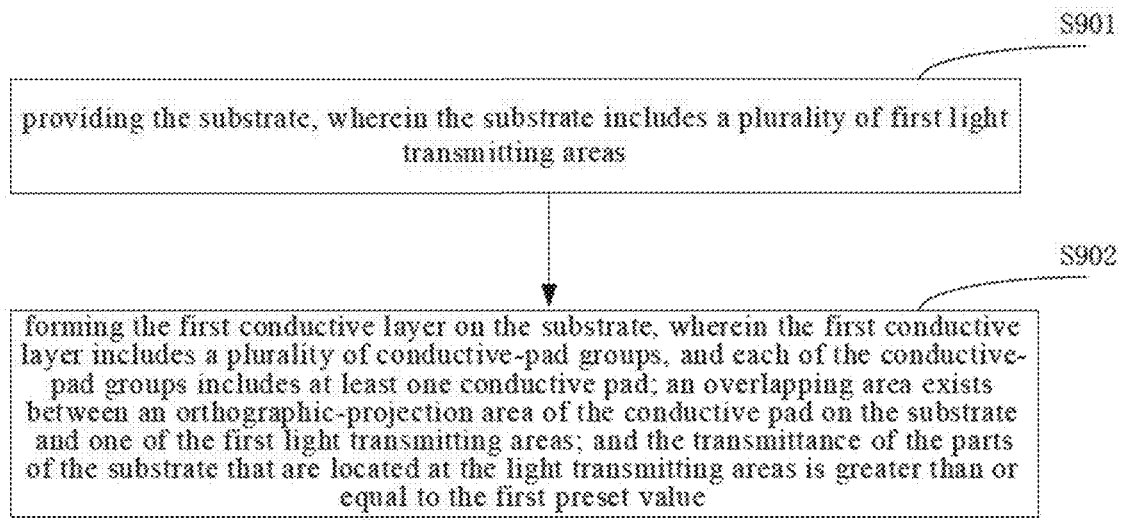
FIG. 18 is a flow chart of the manufacturing method of the array base plate according to an embodiment of the present application.

An embodiment of the present application provides a method a manufacturing the array base plate, wherein the method is applied to fabricate the array base plate stated above. Referring to FIG. 18, the method includes:

S901: providing the substrate 1, wherein the substrate 1 includes a plurality of first light transmitting areas T1.

In some embodiments of the present application, the material of the parts of the substrate 1 that are located at the first light transmitting areas T1 includes a light transmitting material, and/or, the parts of the substrate 1 that are located at the first light transmitting areas T1 are of a hollow structure.

As an example, the light transmitting material may be silica gel, an ultraviolet-light-solidified adhesive, silicon nitride or silicon oxide.

S902: forming the first conductive layer 2 on the substrate 1, wherein the first conductive layer includes a plurality of conductive-pad groups W, and each of the conductive-pad groups W includes at least one conductive pad; an overlapping area exists between orthographic-projection area of each of the conductive pads on the substrate 1 and the first light transmitting area T1; and the transmittance of the parts of the substrate 1 that are located at the first light transmitting areas T1 is greater than or equal to a first preset value.

In some embodiments of the present application, the first preset value is greater than or equal to 50%.

In practical applications, the first preset value may include 50%, 55%, 60%, 70%, 80% and 85%, which may particularly be determined according to the designs and the demands on the transmittance of different products, and is not limited herein.

The meaning of that an overlapping area exists between the orthographic-projection area of each of the conductive pads on the substrate 1 and one of the first light transmitting areas T1 is that the orthographic-projection area of the conductive pad on the substrate 1 and the first light transmitting area T1 at least partially overlap. It may be understood that, if the orthographic-projection area of the conductive pad on the substrate 1 and the first light transmitting area T1 overlap, the size of the overlapping area is not limited herein, and may particularly be determined according to the demands of different products.

As an example, the conductive pad may be a bonding pad.

In some embodiments of the present application, the area of the overlapping area occupies at least a half of the area of the orthographic-projection area of the conductive pad on the substrate 1.

In practical applications, if the area of the back of each of the conductive pads exposed by the first light transmitting areas T1 is small, then the backs of the conductive pads may not be accurately observed by using a back detecting technique, and, in the subsequent process, when the conductive pads and the element devices 3 are being connected, it may not be accurately determined, by using a back detecting technique, whether a connection imperfect exists between the element devices 3 and the conductive pads. In the array base plate according to the embodiments of the present application, by configuring that the area of the overlapping area occupies at least a half of the area of the orthographic-projection areas of the conductive pads (for example, H1 and H2 in FIG. 5b) on the substrate 1, the first light transmitting area T1 may expose at least a half of the area of the back of the conductive pad, which increases the accuracy of the determination using a back detecting technique on whether a connection imperfect exists between the element devices 3 and the conductive pads.

In some embodiments, after the step S902 of forming the first conductive layer 2 on the substrate 1, the method further includes:

S903: connecting the element device 3 and the conductive-pad group W together.

As an example, referring to FIG. 14a, the element device 3 includes a main element-device body 31, a first solder leg 32 and a second solder leg 33. As corresponding to that the conductive-pad group W includes a first conductive pad H1 and a second conductive pad H2. The first solder leg 32 is electrically connected to the first conductive pad H1, and the second solder leg 33 is electrically connected to the second conductive pad H2.

As an example, the array base plate further includes a soldering layer 201, and the soldering layer 201 is located between the element devices 3 and the first conductive layer 2.

In some embodiments, the soldering layer 201 shown in FIG. 11a is printed on the conductive pad. Referring to FIG. 11b, the soldering layer 201 is melted and spread by heating. The melted soldering layer 201 wets the first conductive layer 2, and spreads with the material of the first conductive layer 2. During the process of the reflow soldering, the connecting layer 203 shown in FIG. 11c is formed at the interface between the soldering layer 201 and the first conductive layer 2, thereby completing the soldering.

In the array base plate fabricated by using the manufacturing method according to the present application, by providing the plurality of first light transmitting areas T1 in the substrate 1, and configuring that each of the first light transmitting areas T1 includes a light transmitting material and/or a hollow structure, because the transmittance of the parts of the substrate 1 that are located at the first light transmitting areas T1 is greater than or equal to a first preset value, some of the areas of the backs of the conductive pads may be seen from the parts of the substrate 1 that are located at the first light transmitting areas T1, whereby imperfects of the conductive pads may be directly determined by using a back detecting technique. After the manufacturing of the element devices 3 is completed, connection imperfects between the conductive pads and the element devices 3 may also be directly determined by using a back detecting technique, to intercept and repair array base plates having a connection imperfect, thereby improving the reliability of the product.

Figure 19:
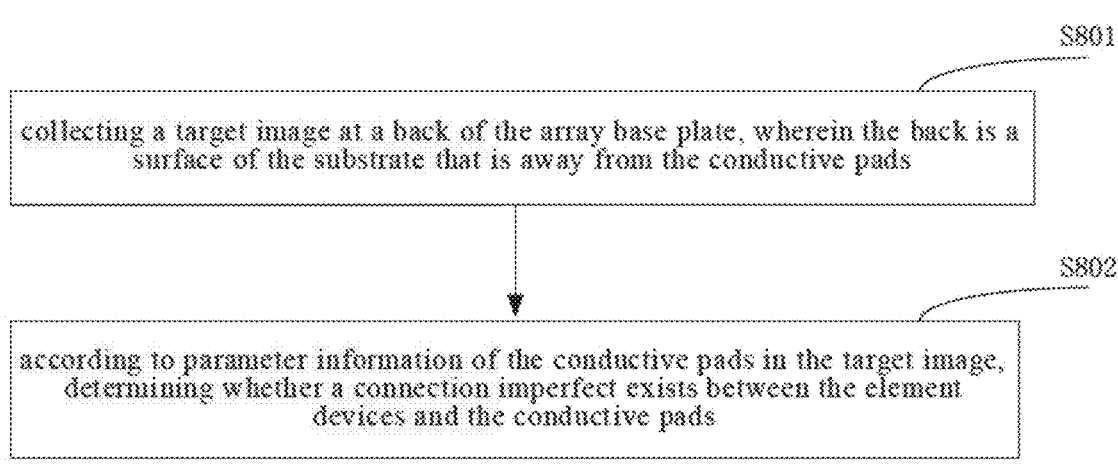
FIG. 19 is a flow chart of the detecting method of the array base plate according to an embodiment of the present application.

In yet another aspect, an embodiment of the present application provides a detecting method, wherein the array base plate includes a plurality of element devices 3, and each of the element devices 3 is electrically connected to the conductive pads in the same one conductive-pad group W. Referring to FIG. 19, the method includes:

S801: collecting a target image at a back of the array base plate, wherein the back is the surface of the substrate 1 that is away from the conductive pads.

The target image refers to an image that is collected from the back of the array base plate through the first light transmitting areas T1 and includes at least one of the conductive pads. It may be understood that the target image is an image of the part of the first conductive layer 2 that includes the conductive pads, and the image presents the morphologies of the surfaces of the conductive pads that are away from the element devices 3.

Figure 13A:
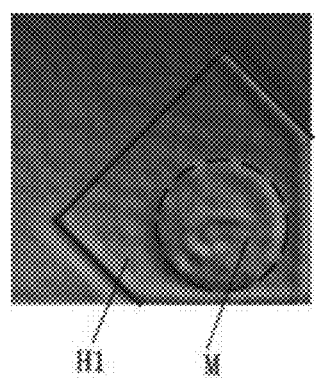
FIG. 13a is a morphologic-characteristic diagram of a soldering imperfect of the bonding pad according to an embodiment of the present application.
Figure 13B:
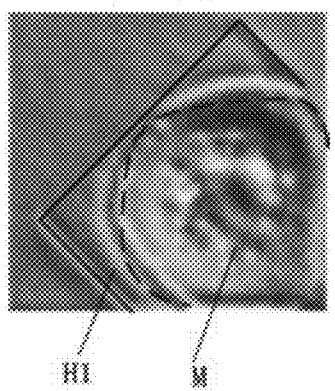
FIG. 13b is a morphologic-characteristic diagram of a qualified soldering of the bonding pad according to an embodiment of the present application.

FIGS. 13a and 13b show two types of different target images.

The target image is obtained by detecting and photographing by using an Automated Optical Inspection (AOI) device. Certainly, another device may also be used. The embodiments of the present application illustrate by taking an AOI device as an example.

S802: according to parameter information of the conductive pads in the target image, determining whether a connection imperfect exists between the element devices 3 and the conductive pads.

The connection imperfect may include soldering imperfects, and the soldering imperfects include a cold joint of a conductive pad, breakage of an conductive pad, corrosion of an conductive pad and so on.

In some embodiments, the parameter information includes the area of the orthographic projection of the connecting layer 203 of the conductive pad on the substrate 1 and the area of the orthographic projections of the solder legs of the element device 3 on the substrate 1.

In some embodiments, the parameter information includes a model image of qualified connection between the element devices 3 and the conductive pads.

In practical applications, after the process of crystal fixing is completed, the process includes firstly performing AOI checking to the front face of the array base plate, to determine the accuracy of the positions of the fixing of the element devices 3; then performing reflow soldering, to solder the element devices 3 and the conductive pads together; and subsequently performing the above-described AOI back detection.

In the detecting method of the array base plate according to the present application, by collecting the target image from the back of the array base plate through the first light transmitting areas T1, and according to the morphologic characteristics presented by the intermetallic compound in the connecting layers 203 of the conductive pads and the outwardly expanded areas of the connecting layers 203 with respect to the solder legs of the element devices 3 in the target image, it is determined whether a connection imperfect exists between the element devices 3 and the conductive pads, which solves the problem in the related art that connection imperfects of array base plates may not be accurately intercepted by using AOI front-face detection.

In some embodiments, after the AOI back detection, a lighting test is further performed, and, according to the result of the lighting test, some of the array base plates having a connection imperfect are further repaired. The particular processes of the lighting and repairing may refer to the related art, and are not discussed herein further.

It should be noted that, in the array base plate applied the detecting method according to the present application, one element device 3 is correspondingly connected to one conductive-pad group W, and the quantity of the solder legs included in the element device 3 and the quantity of the conductive pads included in the conductive-pad group W are equal.

In some embodiments of the present application, the parameter information includes the area of the orthographic projection of the connecting layer 203 of the conductive pad on the substrate 1 and the area of the orthographic projections of the solder legs of the element device 3 on the substrate 1; and the step S802 of, according to the parameter information of the conductive pads in the target image, determining whether a connection imperfect exists between the element devices and the conductive pads particularly includes:

S8021: when the areas of the orthographic projections of the connecting layers of the conductive pads in the conductive-pad groups on the substrate are greater or equal to a second preset value compared with the areas of the orthographic projections of the soldering legs on the substrate, determining that connection between the element devices and the conductive pads is qualified; and; and S8022: when the area of the orthographic projection of the connecting layer of at least one of the conductive pads in the conductive-pad groups on the substrate is less than the second preset value compared with the areas of the orthographic projections of the soldering legs on the substrate, determining that the connection imperfect exists between the element devices and the conductive pads.

It should be noted that, in the soldering process, the interconnection happens between the soldering material of the soldering layer 201 and the first conductive layer 2, whereby the soldering material of the soldering layer 201 melts and spreads at the parts of the first conductive layer 2 that are located at the conductive pads (bonding pads), and further forms the connecting layer 203 shown in FIG. 11c. Because the soldering material spreads, the size of the area of the connecting layer 203 actually formed is equal to the size of the spreading area of the soldering material in the soldering process. In practical applications, the soldering material spreads from the area where a solder leg is located as the center to the periphery, and therefore the actual area of the formed connecting layer 203 is greater than the area of the contacting interface between the solder legs and the soldering material.

FIGS. 13a and 13b show two types of different target images. FIG. 13a is a target image containing a cold joint, and FIG. 13b is a target image of a qualified soldering. It may be seen that, in FIG. 13a, the block structure presented by the inter-layer compound of the connecting layer 203 formed in the soldering-affected zone M of the first conductive pad H1 is not obvious, and the area of the outward expansion of the connecting layer 203 in the soldering-affected zone M is very small, which indicates that the effect of the melting and spreading of the soldering material in the heating is poor, and it may be determined that a soldering imperfect exists between the bonding pad and the element device 3 that correspond to the first conductive pad H1. In FIG. 13b, it may be obviously seen that the intermetallic compound of the connecting layer 203 in the soldering-affected zone M presents a block structure, area of the soldering-affected zone M is large, and the trace of the outward expansion of the connecting layer 203 in the soldering-affected zone M is obvious, and it may be determined that the soldering between the bonding pad and the element device 3 that correspond to the first conductive pad H1 is qualified.

It should be noted that, in FIGS. 13a and 13b, the connecting layer 203 is located in the soldering-affected zone M, and the connecting layer 203 is the part of FIGS. 13a and 13b that presents the block structure.

As an example, the second preset value may include 30%, 35%, 40%, 45% or 50%. Certainly, the second preset value may further include other numerical values, which may be particularly determined according to the type of the soldering material, the soldering temperature and the soldering duration, and is not limited herein.

As an example, if the area of the connecting layer 203 corresponding to each of the solder legs of the element device 3 is greater than the designed area of the solder leg by 30%, it is determined that the soldering of the element device 3 is qualified.

Particularly, if the size of the connecting layer 203 is outwardly expanded as compared with the size of the solder leg by 20 μm, 30 μm, 40 μm, 50 μm, 80 μm or 100 μm, it is determined that the soldering of one of the solder legs of the element device is qualified.

As an example, if the element device 3 includes an LED chip, if the diameter of the solder legs of the LED chip is 90 μm, each of the connecting layers 203 is outwardly expanded with respect to the solder legs by 40 μm, and the diameter of the connecting layers 203 is 130 μm, then it is determined that the soldering of the LED chip is qualified.

Only if all of the solder legs of an element device 3 are qualified, it may be determined that the soldering of the element device 3 is qualified. If the soldering of at least one of the solder legs of an element device 3 is problematic, it is determined that a soldering imperfect exists in the element device 3.

The detecting method according to the present application may be applied to products in which the quantity of the solder legs of the element device 3 and the quantity of the conductive pads of the conductive-pad group W are equal and the solder legs and the conductive pads are electrically connected correspondingly one to one.

It may be understood that, when the quantity of the solder legs of the element device 3 and the quantity of the conductive pads of the conductive-pad group W are unequal, the process may include, according to actual situations, determining the quantity of the conductive pads in the conductive-pad group W that are required to be connected to the solder legs of the element device 3; subsequently, by using a method similar to the detecting method according to the present application, determining the condition of the soldering of each of the conductive pads connected to the solder legs of the element device 3; and, subsequently, determining whether a connection imperfect exists between the element devices 3 and the conductive pads.

In some embodiments of the present application, the parameter information includes a model image of qualified connection between the element devices and the conductive pads.

The model image and the target image are photographed by using the same photographing magnification.

The step S802 of, according to parameter information of the conductive pads in the target image, determining whether a connection imperfect exists between the element devices 3 and the conductive pads includes:

S8023: if a similarity between the conductive pads in the target image and the conductive pads in the model image is greater than or equal to a third preset value, determining that the connection between the element devices 3 and the conductive pads is qualified; and S8024: if a similarity between at least one of the conductive pads in the target image and the conductive pads in the model image is less than the third preset value, determining that a connection imperfect exists between the element devices and the conductive pads.

It should be noted that, in the soldering process, the soldering material of the soldering layer 201 and the first conductive layer 2 interact, whereby the soldering material of the soldering layer 201 melts and spreads on the conductive pad, and further forms the connecting layer 203 shown in FIG. 11c. If the soldering is qualified, the intermetallic compound is formed in the connecting layer 203, wherein the intermetallic compound presents one or more of the block structure M1, the rice-granular structure M2, the conchoid structure and the dendriform structure. It may be understood that, according to the morphologic characteristics of the connecting layer 203 in the target image, it may be determined whether the connection of the element device 3 is qualified.

Particularly, taking the case as an example for the description in which the characteristic morphology in the model image is the block structure M1, if the connecting layer 203 of the conductive pad in the target image forms a characteristic morphology having the block structure M1, and the area of the outward expansion of the connecting layer 203 satisfies the requirements, the similarity between the target image and the model image is greater than or equal to a third preset value, which indicates that the soldering between the corresponding element device 3 and the conductive pad is qualified. If the connecting layer 203 of the conductive pad in the target image does not form a characteristic morphology having the block structure M1, or the area of the formed characteristic morphology having the block structure is small (as shown in FIG. 13a), the similarity between the target image and the model image is less than the third preset value, which indicates that a soldering imperfect exists between the corresponding element device 3 and the conductive pad.

As an example, the third preset value may be 40%, 45% or 50%.

In the detecting method of the array base plate according to the present application, by collecting the target image from the back of the array base plate through the first light transmitting areas T1, and according to the morphologic characteristics presented by the intermetallic compound in the connecting layers 203 of the conductive pads and the outwardly expanded areas of the connecting layers 203 with respect to the solder legs of the element devices 3 in the target image, it is determined whether a connection imperfect exists between the element devices 3 and the conductive pads, which solves the problem in the related art that connection imperfects of array base plates may not be accurately intercepted by using AOI front-face detection.

In practical applications, if a base plate having a connection imperfect is detected by an AOI detecting apparatus by using the above method, according to the particular type of the imperfect, then artificial detection or repairing is further performed.

As an example, if a cold joint is detected, the conductive pad is directly repaired by using a repairing device. If it is detected that a conductive pad is damaged, it is required to perform artificial detection again, to determine the damaging area. If the damaging area is less than or equal to a fourth preset value, it may be considered that the damage does not affect the normal usage of the array base plate. If the damaging area is greater than the fourth preset value, the array base plate should be scrapped.

As an example, the fourth preset value may include 5%, 10%, 15% or 20%.

The above are merely particular embodiments of the present application, and the protection scope of the present application is not limited thereto. All of the variations or substitutions that a person skilled in the art can easily envisage within the technical scope disclosed by the present application should fall within the protection scope of the present application. Therefore, the protection scope of the present application should be subject to the protection scope of the claims.

The invention claimed is:

1. An array base plate, wherein the array base plate comprises:
    a substrate, wherein the substrate comprises a plurality of first light transmitting areas; and
    a first conductive layer located on the substrate;
    the first conductive layer comprises a plurality of conductive-pad groups, and each of the conductive-pad groups comprises at least one conductive pad;

an overlapping area exists between an orthographic-projection area of the conductive pad on the substrate and one of the first light transmitting areas; and a transmittance of parts of the substrate that are located at the first light transmitting areas is greater than or equal to a first preset value.

2. The array base plate according to claim 1, wherein the first preset value is greater than or equal to 50%.

3. The array base plate according to claim 1, wherein an area of the overlapping area occupies at least a half of an area of the orthographic-projection area of the conductive pad on the substrate.

4. The array base plate according to claim 3, wherein an edge of the orthographic-projection area of the conductive pad on the substrate is located within the first light transmitting area.

5. The array base plate according to claim 2, wherein a material of the parts of the substrate that are located at the first light transmitting areas comprises a light transmitting material, and/or, the parts of the substrate that are located at the first light transmitting areas are of a hollow structure.

6. The array base plate according to claim 1, wherein at least two of the first light transmitting areas are communicated and form a second light transmitting area.

7. The array base plate according to claim 6, wherein orthographic-projection areas of some of the conductive-pad groups on the substrate overlap with the second light transmitting area.

8. The array base plate according to claim 6, wherein the substrate further comprises a plurality of third light transmitting areas;
the first conductive layer further comprises a plurality of traces, and the traces are electrically connected to the conductive pad; and
orthographic-projection areas of at least some of the traces on the substrate overlap with the third light transmitting areas.

9. The array base plate according to claim 8, wherein some of the third light transmitting areas are in communication with some of the first light transmitting areas, and/or, some of the third light transmitting areas are in communication with some of the second light transmitting areas.

10. The array base plate according to claim 8, wherein the substrate comprises a bottom layer and a second conductive layer located on the bottom layer, and the second conductive layer is insulated from the first conductive layer;
the second conductive layer comprises a plurality of driving lines that are arranged in a first direction and extend in a second direction; and
an orthographic projection of the third light transmitting area on the bottom layer is within an area between orthographic projections of two adjacent driving lines on the bottom layer.

11. The array base plate according to claim 10, wherein at least some of the third light transmitting areas are arranged in the first direction, and extend in the second direction.

12. The array base plate according to claim 1, wherein a distance from a contour of an orthographic projection of the light transmitting area on the first conductive layer to the conductive pad ranges 0-200 μm.

13. The array base plate according to claim 12, wherein the array base plate further comprises a plurality of element devices, and each of the element devices is electrically connected to a same conductive-pad groups;

a plurality of the conductive-pad groups are arranged in an array, and each of the conductive pads comprises a metal layer and a connecting layer located on the metal layer;
the connecting layer is located between the metal layer and the element devices, and the metal layer is connected to the element devices by the connecting layer; and
the connecting layer comprises an intermetallic compound, and a morphology of the intermetallic compound is at least one of a block structure, a conchoid structure, a dendriform structure and a rice-granular structure.

14. The array base plate according to claim 13, wherein the array base plate further comprises a soldering layer, the soldering layer is located between solder legs of each of the element devices and the conductive pad, and the soldering layer comprises a soldering material; and
when the soldering layer and the conductive pad directly contact, the morphology of the intermetallic compound is the rice-granular structure.

15. The array base plate according to claim 13, wherein the array base plate further comprises a soldering layer, the soldering layer is located between solder legs of each of the element devices and the conductive pad, and the soldering layer comprises a soldering material; and
when an inhibiting layer is arranged between the soldering layer and the conductive pad, the morphology of the intermetallic compound is one or more of the block structure, the conchoid structure and the dendriform structure.

16. The array base plate according to claim 1 wherein the substrate comprises a bottom layer, and a buffer layer, a second conductive layer, a first insulating layer, a first planarization layer and a second insulating layer that are located on the bottom layer and are sequentially arranged in stack;
all of materials of the buffer layer, the first insulating layer, the first planarization layer and the second insulating layer are a light transmitting material; and
a material of parts of the second conductive layer that are located at the light transmitting areas is a light transmitting material, or, parts of the second conductive layer that are located at the light transmitting areas are of a hollow structure.

17. A light emitting apparatus, wherein the light emitting apparatus comprises the array base plate according to claim 1.

18. A detecting method, wherein the detecting method is applied to detection on the array base plate according to claim 1, the array base plate comprises a plurality of element devices, each of the element devices is electrically connected to the conductive pads in a same conductive-pad groups, and the method comprises:
collecting a target image at a back of the array base plate, wherein the back is a surface of the substrate that is away from the conductive pads; and
according to parameter information of the conductive pads in the target image, determining whether a connection imperfect exists between the element devices and the conductive pads.

19. The detecting method according to claim 18, wherein the parameter information comprises an area of an orthographic projection of the connecting layer of the conductive pad on the substrate and an area of an orthographic projection of solder legs of the element devices on the substrate; and according to the parameter information of the conductive pads in the target image, determining whether the connection imperfect exists between the element devices and the conductive pads comprises:

when the areas of the orthographic projections of the connecting layers of the conductive pads in the conductive-pad groups on the substrate are greater or equal to a second preset value compared with the areas of the orthographic projections of the soldering legs on the substrate, determining that connection between the element devices and the conductive pads is qualified; and when the area of the orthographic projection of the connecting layer of at least one of the conductive pads in the conductive-pad groups on the substrate is less than the second preset value compared with the areas of the orthographic projections of the soldering legs on the substrate, determining that the connection imperfect exists between the element devices and the conductive pads.

20. The detecting method according to claim 18, wherein the parameter information comprises a model image of qualified connection between the element devices and the conductive pads; and according to the parameter information of the conductive pads in the target image, determining whether the connection imperfect exists between the element devices and the conductive pads comprises:

when a similarity between the conductive pads in the target image and the conductive pads in the model image is greater than or equal to a third preset value, determining that connection between the element devices and the conductive pads is qualified; and when a similarity between at least one of the conductive pads in the target image and the conductive pads in the model image is less than the third preset value, determining that a connection imperfect exists between the element devices and the conductive pads.

\* \* \* \* \*